United States Patent
Inao et al.

(10) Patent No.: US 8,377,727 B2
(45) Date of Patent: Feb. 19, 2013

(54) SURFACE-EMITTING LASER AND SURFACE-EMITTING LASER ARRAY, METHOD OF MANUFACTURING A SURFACE-EMITTING LASER AND METHOD OF MANUFACTURING A SURFACE-EMITTING LASER ARRAY, AND OPTICAL APPARATUS INCLUDING A SURFACE-EMITTING LASER ARRAY

(75) Inventors: Yasuhisa Inao, Tokyo (JP); Tatsuro Uchida, Machida (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/286,973

(22) Filed: Nov. 1, 2011

(65) Prior Publication Data
US 2012/0114005 A1  May 10, 2012

(30) Foreign Application Priority Data
Nov. 5, 2010  (JP) ................................. 2010-249129

(51) Int. Cl.
*H01L 21/8252* (2006.01)
*H01S 5/125* (2006.01)
*H01S 5/323* (2006.01)

(52) U.S. Cl. ................ 438/29; 438/34; 438/41; 438/47; 372/50.11

(58) Field of Classification Search .................... 438/29, 438/31, 41; 372/50.11
See application file for complete search history.

(56) References Cited

U.S. PATENT DOCUMENTS
7,807,485 B2 * 10/2010 Uchida et al. ................ 438/29

FOREIGN PATENT DOCUMENTS
JP  2010-40600  2/2010

* cited by examiner

*Primary Examiner* — Olik Chaudhuri
*Assistant Examiner* — Wilner Jean Baptiste
(74) *Attorney, Agent, or Firm* — Fitzpatrick, Cella, Harper & Scinto

(57) ABSTRACT

Provided is a method of manufacturing a surface-emitting laser capable of preventing characteristics fluctuations within the plane and among wafers and oscillating in a single fundamental transverse mode. The method includes after performing selective oxidation: exposing a bottom face of a surface relief structure by etching a second semiconductor layer with a first semiconductor layer where a pattern of the surface relief structure has been formed as an etching mask and a third semiconductor layer as an etching stop layer; and exposing a top face of the surface relief structure by etching the first semiconductor layer where the pattern of the surface relief structure has been formed, with the second semiconductor layer and the third semiconductor layer as etching stop layer.

14 Claims, 16 Drawing Sheets

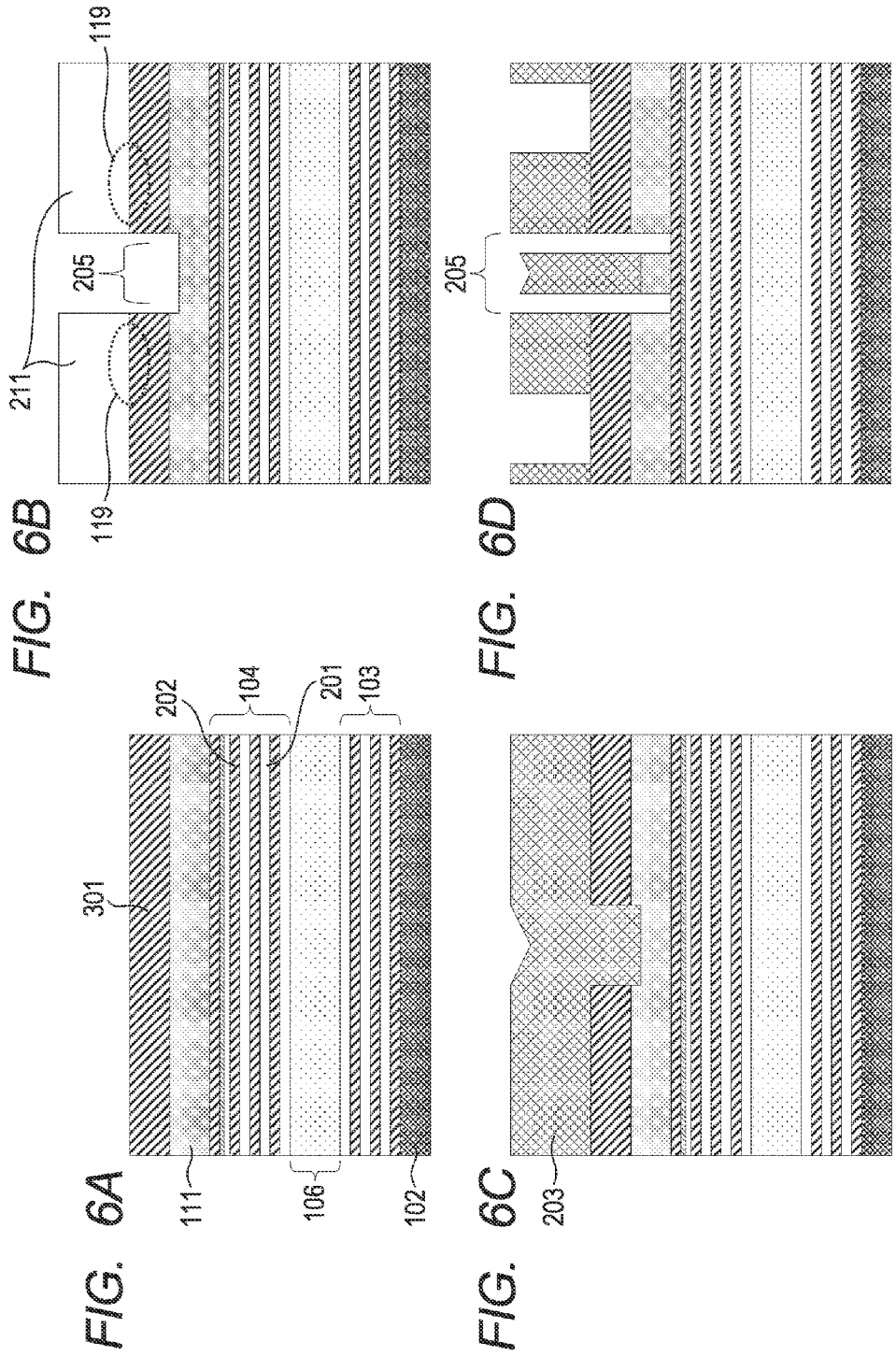

SURFACE-EMITTING LASER AND SURFACE-EMITTING LASER ARRAY, METHOD OF MANUFACTURING A SURFACE-EMITTING LASER AND METHOD OF MANUFACTURING A SURFACE-EMITTING LASER ARRAY, AND OPTICAL APPARATUS INCLUDING A SURFACE-EMITTING LASER ARRAY

BACKGROUND OF THE INVENTION

1. Field of the Invention

The present invention relates to a surface-emitting laser and a surface-emitting laser array, a method of manufacturing a surface-emitting laser and a method of manufacturing a surface-emitting laser array, and an optical apparatus that includes a surface-emitting laser array.

2. Description of the Related Art

Vertical-cavity surface-emitting lasers (VCSELs) emit laser light vertically with respect to the in-plane direction of a semiconductor substrate.

A common structure of VCSELs has an active region in a region that is sandwiched between a pair of distributed Bragg reflectors (DBRs) stacked on a substrate.

Various methods have been studied to cause a surface-emitting laser of this type to oscillate in a single transverse mode.

In an example of the methods, the single transverse mode is achieved by reducing the current confinement diameter to a size that cuts off high-order transverse modes when a current confinement structure is formed through selective oxidation.

In another example of the methods, a light emission surface of a VCSEL is provided with a structure that causes a reflectance distribution within the plane (hereinafter, referred to as surface relief structure) and the reflectance is set lower in high-order transverse modes than in low-order transverse modes, to thereby prevent oscillation in high-order transverse modes.

One of the matters to be kept in mind when using the surface relief structure is that the reflectance distribution of the surface relief structure and the light distribution in transverse mode oscillation need to coincide with each other with high precision.

Japanese Patent Application Laid-Open No. 2010-040600 proposes a simple manufacturing process that accomplishes this positioning of the surface relief structure and the light mode. In Japanese Patent Application Laid-Open No. 2010-040600, a pattern for forming a mesa structure of a surface-emitting laser and a pattern for forming the surface relief structure are formed by the same process. This method allows the center point of the mesa structure to coincide with the center point of the surface relief structure. The mesa structure defines a current confinement structure because the current confinement structure is formed by selective oxidation that is performed on side faces of the mesa structure. The current confinement structure defines the light distribution in transverse modes. Therefore, the positional relation between the light mode and the surface relief structure is determined once the positional relation between the mesa structure and the surface relief structure is determined.

Japanese Patent Application Laid-Open No. 2010-040600 also reduces process damage to the surface relief structure by forming the surface relief structure in two stages and putting the second half etching step after the forming of the current confinement structure.

The surface relief structure is thus protected from process damage and the bottom face of the surface relief structure is formed in a stable manner.

The manufacturing method of Japanese Patent Application Laid-Open No. 2010-040600 is a fairly practical method as described above.

However, the top face of the surface relief structure needs to be controlled in order to manufacture a desired surface-emitting laser with higher precision.

More specifically, the top face of the surface relief structure in Japanese Patent Application Laid-Open No. 2010-040600 is the topmost surface formed through crystal growth. The topmost surface formed through crystal growth suffers various kinds of damage including surface roughening, shaving, and plasma damage in the subsequent processes. It is therefore difficult to keep the surface formed through crystal growth in its original state until the completion of the device, and the resultant device characteristics may deviate from designed device characteristics.

The damage caused during manufacturing processes which is not uniform within the plane is particularly difficult to control.

This varies the state of the top face of the surface relief structure from one device to another, thereby causing device characteristics fluctuations within the plane and among wafers.

SUMMARY OF THE INVENTION

The present invention has been made in view of the problem described above, and it is an object of the present invention to provide a surface-emitting laser capable of preventing characteristics fluctuations within the plane and among wafers and oscillating in a single fundamental transverse mode, and a method of manufacturing the surface-emitting laser.

It is also an object of the present invention to provide a method of manufacturing a surface-emitting laser array that uses this method of manufacturing a surface-emitting laser, the surface-emitting laser array, and an optical apparatus that includes the surface-emitting laser array.

A method of manufacturing a surface-emitting laser according to the present invention is a method of manufacturing a surface-emitting laser with a surface relief structure which has a stepped structure for controlling a reflectance distribution, comprising; forming a lower distributed Bragg reflector (DBR) on a substrate; forming an active region on the lower DBR, forming on the active region an upper DBR, which comprises a selective oxidation layer and a layered structure, the layered structure being obtained by stacking a fourth semiconductor layer, a third semiconductor layer, and a second semiconductor layer in order from the substrate side; forming a first semiconductor layer on the upper DBR; forming a first dielectric film on the first semiconductor layer; patterning the first dielectric film by forming in the first dielectric film a pattern that defines the surface relief structure and a pattern that defines a mesa structure with use of a same photomask, forming in the first semiconductor layer a pattern of the surface relief structure and a pattern of the mesa structure which are defined by the patterns in the first dielectric film, by etching the first semiconductor layer with use of the first dielectric film which has been patterned in the patterning; forming a second dielectric film on the first semiconductor layer that comprises the pattern of the surface relief structure which has been formed in the first semiconductor layer; forming a photoresist pattern in a manner that covers the pattern of the surface relief structure which comprises the second dielectric film, forming the mesa structure by etching through dry etching the pattern of the mesa structure which has been formed in the first semiconductor layer, forming a current confinement structure by selective oxidation of the selective oxidation layer; removing the first dielectric film and the second dielectric film, exposing a bottom face of the surface relief structure by etching the second semiconductor layer with the first semiconductor layer where the pattern of the surface relief structure has been formed as an etching mask and the third semiconductor layer as an etching stop layer; exposing a top face of the surface relief structure by etching the first semiconductor layer where the pattern of the surface relief structure has been formed, with the second semiconductor layer and the third semiconductor layer as etching stop layers, and protecting a region of the first semiconductor layer that is located on a perimeter of the bottom face of the surface relief structure and that functions as a contact portion, wherein, when an oscillation wavelength of the surface-emitting laser is given as $\lambda$ and a refractive index of each of the semiconductor layers is given as n, a total thickness of the second semiconductor layer, the third semiconductor layer, and the fourth semiconductor layer is an integral multiple of $\lambda/2n$.

A method of manufacturing a surface-emitting laser array according to the present invention is a method of manufacturing a surface-emitting laser array, comprising arranging multiple surface-emitting lasers manufactured by the method of manufacturing a surface-emitting laser according to claim 1, to thereby manufacture a surface-emitting laser array.

A surface-emitting layer according to the present invention is a surface-emitting layer, comprising; multiple semiconductor layers which comprise a lower DBR, an active region, an upper DBR, and a contact portion and which are stacked on a substrate, and a mesa structure in which a light emission portion of the upper DBR is provided with a surface relief structure having a stepped structure, which is constructed in order to control a reflectance distribution, wherein the surface relief structure has a surface that is located on a lower level than the contact portion.

A surface-emitting laser array according to the present invention is a surface-emitting laser array, comprising a plurality of the above-mentioned surface-emitting lasers that are arranged into an array.

An optical apparatus according to the present invention is an optical apparatus, comprising the above-mentioned surface-emitting laser as a light source.

The present invention realizes the surface-emitting laser capable of preventing characteristics fluctuations within the plane and among wafers and oscillating in the single fundamental transverse mode, and the method of manufacturing the surface-emitting laser.

Further, the present invention realizes the method of manufacturing a surface-emitting laser array that uses the above-mentioned method of manufacturing a surface-emitting laser, the surface-emitting laser array, and the optical apparatus that includes the surface-emitting laser array.

Further features of the present invention will become apparent from the following description of exemplary embodiments with reference to the attached drawings.

BRIEF DESCRIPTION OF THE DRAWINGS

FIG. 6A is a process step diagram illustrating a step in a method of manufacturing the surface-emitting laser with the surface relief structure according to the second embodiment of the present invention.

FIG. 6B is a process step diagram illustrating a step in the method of manufacturing the surface-emitting laser with the surface relief structure according to the second embodiment of the present invention.

FIG. 6C is a process step diagram illustrating a step in the method of manufacturing the surface-emitting laser with the surface relief structure according to the second embodiment of the present invention.

FIG. 6D is a process step diagram illustrating a step in the method of manufacturing the surface-emitting laser with the surface relief structure according to the second embodiment of the present invention.

DESCRIPTION OF THE EMBODIMENTS

Figure 1:
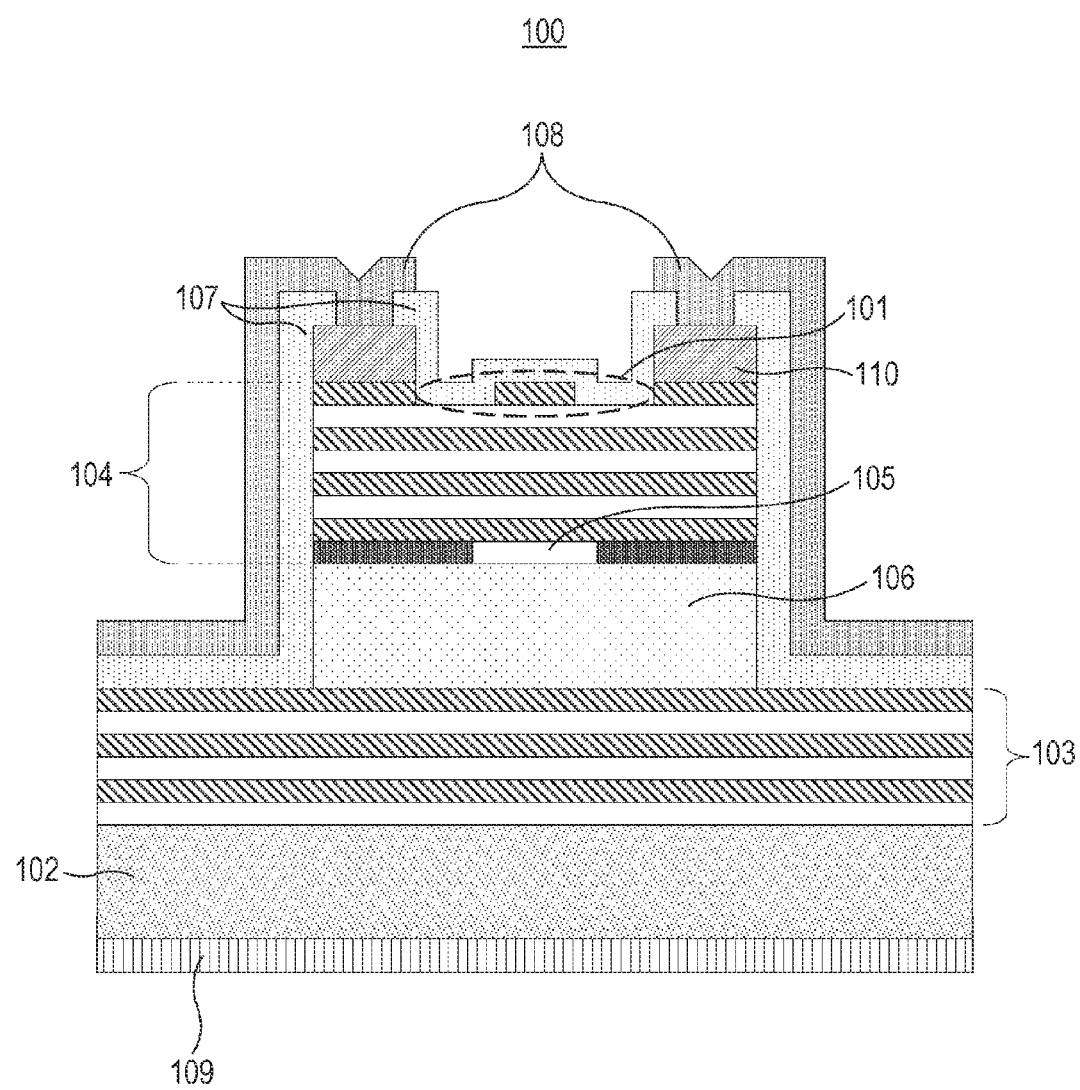
FIG. 1 is a sectional view illustrating the structure of a surface-emitting laser according to a first embodiment of the present invention.

According to the present invention, when a surface relief structure is manufactured from a stepped structure which is constructed in a light emission portion of an upper DBR of a surface-emitting laser in order to control the reflectance distribution, the surface relief structure is formed in a stable manner by utilizing a boundary between different materials which results from crystal growth as the surface relief structure, in particular, surfaces of the surface relief structure.

Reasons that conventional technologies have not been successful in forming a boundary in a stable manner through crystal growth are as described above and, for those reasons, the top face and bottom face of a surface relief structure need to be formed after processes that cause damage.

However, the conventional method which uses self-alignment needs to put patterning at the beginning of the series of processes.

The self-alignment method thus conflicts with the need to form surfaces of a surface relief structure after processes that cause damage.

The inventors of the present invention have therefore sought for and found a method of forming surfaces of a surface relief structure after damage is caused.

In the VCSEL manufacturing process of Japanese Patent Application Laid-Open No. 2010-040600 which uses self-alignment, main processes that cause damage are the forming and removal of a dielectric film necessary to form a surface relief structure and a mesa structure at the same time by self-alignment, the removal of a photoresist that is used to form the mesa structure, and asking for removing a photoresist in every process.

An etchant used when the bottom face of the surface relief structure is formed also damages the top face of the surface relief structure.

Finishing these processes without exposing boundaries that constitute (the top face and bottom face of) the surface relief structure is a feature of a manufacturing method according to the present invention.

Specifically, the present invention solves the problem described above by performing the processes that cause damage while a first semiconductor layer, which doubles as a contact layer, protects the top face of the surface relief structure and a second semiconductor layer protects the bottom face of the surface relief structure, and then exposing the top face and bottom face of the surface relief structure through selective etching.

EXAMPLES

Embodiments of the present invention are described below.

First Embodiment

Discussed in a first embodiment are a surface-emitting laser with a convex surface relief structure to which the present invention is applied and a method of manufacturing the surface-emitting laser.

The surface-emitting laser of this embodiment has a mesa structure in which multiple semiconductor layers including a lower DBR, an active region, an upper DBR, and a contact portion are stacked on a substrate, and a light emission portion of the upper DBR is provided with a surface relief structure constituted of a stepped structure, which is constructed in order to control the reflectance distribution.

Specifically, the surface-emitting laser of this embodiment has a structure of FIG. 1. In FIG. 1, a surface-emitting laser 100 includes a surface relief structure 101, a substrate 102, a lower DBR 103, and an upper DBR 104.

Further, the surface-emitting laser 100 includes a current confinement portion 105, an active region 106, an insulating film 107, an upper electrode 108, and a lower electrode 109.

This surface-emitting laser 100 has a columnar mesa structure.

The surface relief structure 101 is described with reference to FIG. 2.

Figure 2:
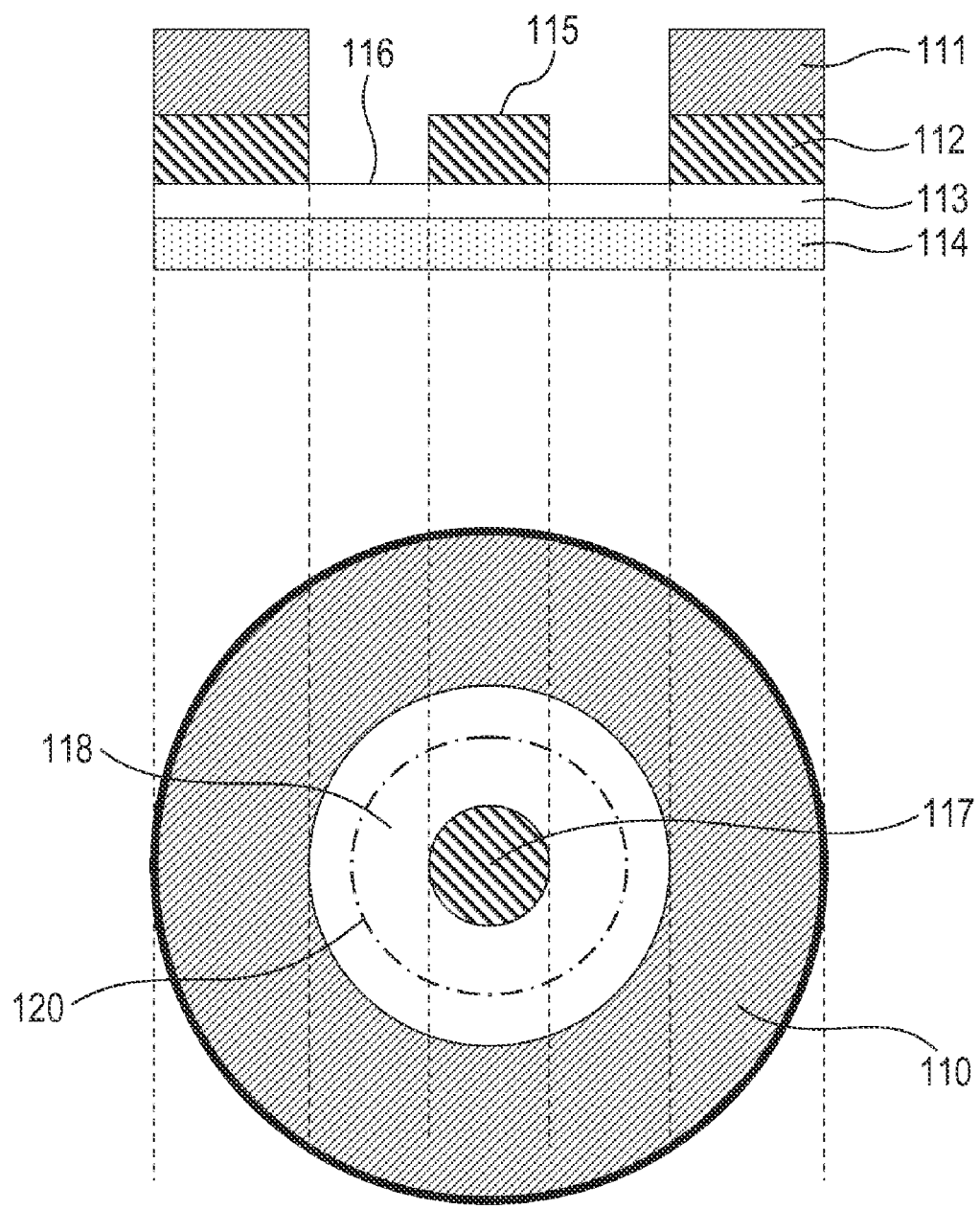
FIG. 2 is a diagram illustrating a surface relief structure of the surface-emitting laser according to the first embodiment of the present invention.

FIG. 2 above is a sectional view of the surface relief structure 101 and FIG. 2 below is a plan view of the surface relief structure 101 viewed from above.

The convex structure of the surface relief structure 101 is formed from a second semiconductor layer 112. Hereinafter, a surface of the convex structure is referred to as surface relief top 115. The second semiconductor layer 112 is removed from around the convex structure to expose a third semiconductor layer 113. The exposed surface is hereinafter referred to as surface relief bottom 116.

In this embodiment, the wafer is designed such that the surface relief top 115 serves as a high reflection region 117 which has a high reflectance whereas the surface relief bottom 116 serves as a low reflection region 118 which has a low reflectance.

The high reflection region 117 is formed in a manner that controls the position of the high reflection region 117 within the plane with respect to the current confinement portion. A contact portion 110 which is a layer necessary to allow a current to flow from an electrode is formed around the surface relief bottom 116 from a first semiconductor layer 111. Denoted by 120 is the border of the current confinement portion.

A method of manufacturing the surface-emitting laser with the surface relief structure according to this embodiment is described next with reference to FIGS. 3A to 3D, 4A to 4D, and 5A to 5D.

A layered structure is formed as a wafer for a VCSEL by stacking on the substrate 102 the lower DBR 103, the active region 106, the upper DBR 104, and the first semiconductor layer 111 which constitutes a contact layer, in the order stated.

The wafer is designed such that the contact layer is not a part of the upper DBR 104. Specifically, the upper DBR 104 is built from a structure obtained by stacking alternately layers high in refractive index and layers low in refractive index each of which has a thickness of $\lambda/4n$ when the oscillation wavelength of the VCSEL is given as $\lambda$ and the refractive index of each semiconductor layer is given as n.

Hereinafter, of the layers that constitute the DBR, the layers low in refractive index are referred to as low refractive index layers 201 and the layers high in refractive index are referred to as high refractive index layers 202.

Multiple pairs of one low refractive index layer 201 and one high refractive index layer 202 are stacked to obtain a reflectance suited to the wafer design.

In order to form a current confinement structure by selective oxidation, at least one layer of the multiple low refractive index layers 201 needs to serve as a selective oxidation layer 207 by substituting with $Al_xGa_{1-x}As$ (x>0.85), which allows selective oxidation.

It is also necessary for the selective oxidation layer to be higher in oxidation rate in selective oxidation than the other DBR layers. When introducing a selective oxidation layer to a DBR made of $Al_{0.9}Ga_{0.1}As/Al_{0.5}Ga_{0.5}As$ which is used in this embodiment, the selective oxidation layer needs to be formed from a material that is higher in oxidation rate than $Al_{0.9}Ga_{0.1}As$, for example, $Al_{0.98}Ga_{0.02}As$.

The structure of the upper DBR in this embodiment includes a layered structure in which a fourth semiconductor layer, the third semiconductor layer, and the second semiconductor layer are stacked in order from the substrate side.

The total thickness of the second to fourth semiconductor layers is an integral multiple of $\lambda/2n$ when the oscillation wavelength of the surface-emitting laser to be manufactured is given as $\lambda$ and the refractive index of each of the semiconductor layers is given as n.

When the refractive indices of the fourth semiconductor layer, the third semiconductor layer, and the second semiconductor layer are given as n4, n3, and n2, respectively, and the refractive index of the first semiconductor layer which is described later is given as n1, these refractive indices satisfy a relation n4<n3<n2<n1 to make the reflectance highest at the border between n2 and n1.

Specifically, the last three layers of the upper DBR are formed as follows.

The last three layers of the upper DBR counted from the side of the contact layer, which is the first semiconductor layer 111 formed on the upper DBR, are the second semiconductor layer 112, the third semiconductor layer 113, and the fourth semiconductor layer 114.

The second semiconductor layer 112 is formed from the same material as that of the high refractive index layers 202, and the fourth semiconductor layer 114 is formed from the same material as that of the low refractive index layers 201.

The third semiconductor layer 113 is made from a material that functions as an etching stop layer in the etching of the second semiconductor layer 112, and desirably has a refractive index between the refractive index of the second semiconductor layer 112 and the refractive index of the fourth semiconductor layer 114.

The upper DBR in this embodiment is designed to have the highest reflectance on the outermost surface. The last layer of the upper DBR is therefore desirably a high refractive index layer.

In order to make the last three layers of the upper DBR consistent with their underlying DBR layers, the total thickness of the three layers, namely, the second semiconductor layer 112, the third semiconductor layer 113, and the fourth semiconductor layer 114, is preferably $\lambda/2n$.

For example, when the thickness of the second semiconductor layer 112 is $\lambda/4n$, the total thickness of the third semiconductor layer 113 and the fourth semiconductor layer 114 is $\lambda/4n$.

Setting the thicknesses of the second to fourth semiconductor layers in this manner makes the reflectance lowest on the surface relief bottom 116 and highest on the surface relief top 115, thereby maximizing the reflectance difference.

High-order transverse mode is thus suppressed most effectively. While the semiconductor layer thickness is $\lambda/4n$ in the description given here, the same effect can be obtained if the semiconductor layer thickness is an odd multiple of $\lambda/4n$.

To give another example, the thickness of the second semiconductor layer 112 may be set to $\lambda/8n$ to give the third and fourth semiconductor layers a total thickness of $3\lambda/8n$.

In this example, the reflectance difference between the surface relief top 115 and the surface relief bottom 116 is small but the overall reflectance is high, which keeps the threshold current value low.

For instance, when the current confinement portion has a small unoxidized region, even a surface-emitting laser without a surface relief structure has a current injection region, which can oscillate slightly in a fundamental transverse mode.

Adding a surface relief structure to this surface-emitting laser enables the entire current injection region to oscillate in a single fundamental transverse mode, even if the effect of suppressing high-order transverse mode is small.

Further, the overall drop in reflectance is prevented and the threshold current value is kept from rising, with the result that the surface-emitting laser develops even more favorable characteristics.

As examined above, the preferred semiconductor layer thickness, in other words, the preferred height from the top face of the surface relief structure to its bottom face, may vary depending on the design of the surface-emitting laser. The semiconductor layer thickness can therefore be determined to suit the design and use of the surface-emitting laser.

Concrete materials used in the surface-emitting laser are described. This embodiment takes as an example a case where a red-light emitting material is provided in the active region.

Upper and lower DBRs are formed in general from a material that does not absorb red, for example, $Al_xGa_{0.1}As$ whose Al composition x is larger than 0.4.

When a DBR is made from this material, $Al_{0.9}Ga_{0.1}As$ and $Al_{0.5}Ga_{0.5}As$, for example, are used for the low refractive index layers and high refractive index layers, respectively.

The materials given here are an example of materials that constitute upper and lower DBRs, and the present invention is not limited to these materials.

A surface-emitting laser that emits red light, too, may use a combination of materials having different refractive indices, such as a combination of $Al_{0.4}Ga_{0.6}As$ and $Al_{0.8}Ga_{0.2}As$. This widens the selection range in selective oxidation while securing the refractive index difference of the DBR. A surface-emitting laser that emits infrared light can use a combination of materials having a larger difference in refractive index, such as a combination of $Al_{0.1}Ga_{0.9}As$ and AlAs, and requires fewer layers in order to obtain a desired reflectance.

The material composition of the upper DBR and the material composition of the lower DBR may differ from each other.

After that, in a step of forming the first semiconductor layer, the first semiconductor layer 111 is grown on the upper DBR 104 as the contact layer which is higher in refractive index than the layers of the upper DBR.

The contact layer, namely, the first semiconductor layer 111, is formed in general from GaAs, which is low in contact resistance with respect to metal and degenerates little in the air. This embodiment, too, uses GaAs for the contact layer.

Figure 3B:
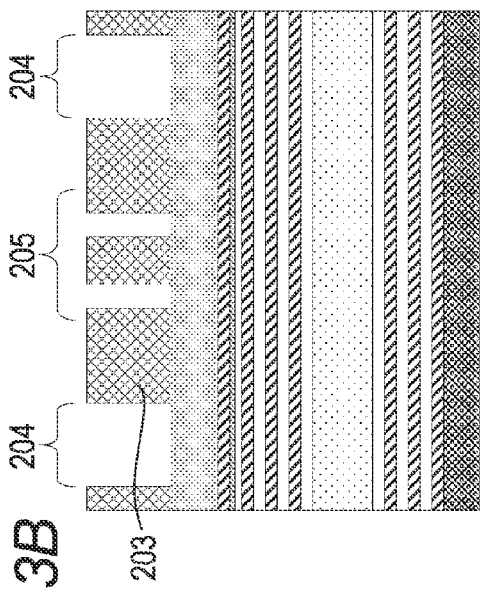
FIG. 3B is a process step diagram illustrating a step in the method of manufacturing the surface-emitting laser with the surface relief structure according to the first embodiment of the present invention.
Figure 3D:
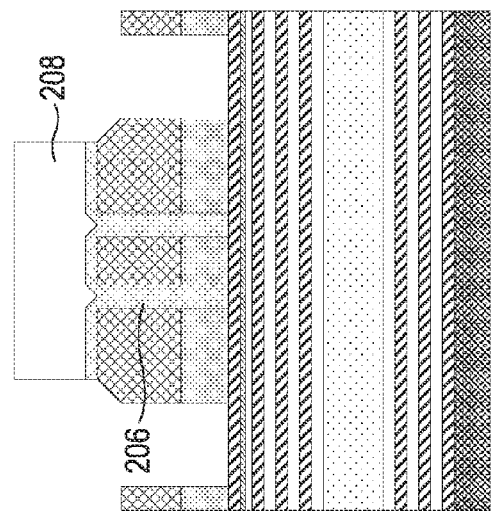
FIG. 3D is a process step diagram illustrating a step in the method of manufacturing the surface-emitting laser with the surface relief structure according to the first embodiment of the present invention.
Figure 3A:
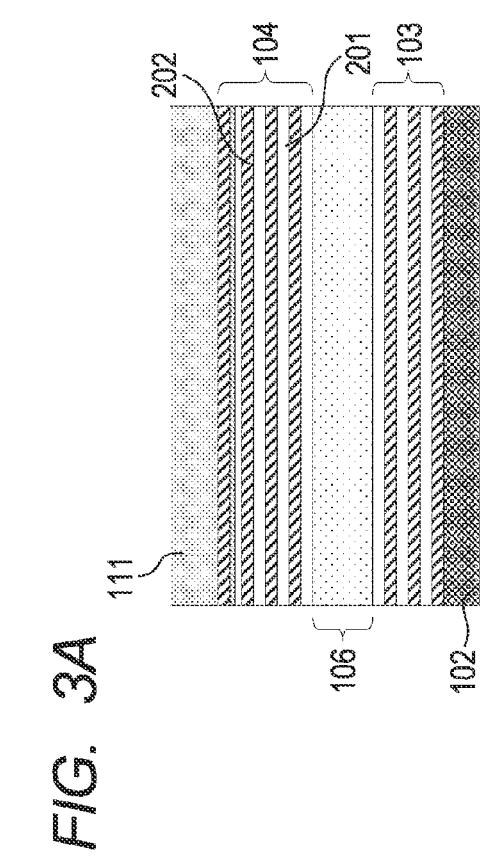
FIG. 3A is a process step diagram illustrating a step in a method of manufacturing the surface-emitting laser with the surface relief structure according to the first embodiment of the present invention.

These layers are formed on a GaAs substrate through crystal growth by metal-organic chemical vapor deposition (MOCVD) or molecular beam epitaxy (MBE) (FIG. 3A).

Next, in a step of forming a first dielectric film, a first dielectric film 203 is formed as an etching mask on the wafer where crystals have been grown in the manner described above (on the first semiconductor layer). An etching pattern of a surface relief structure portion 205 and an etching pattern of a trench portion 204 for defining a mesa structure are formed in the first dielectric film 203 at once with use of the same photomask by photolithography and wet etching. The used photoresist is removed (FIG. 3B).

The first dielectric film 203 in this embodiment is formed from SiO. Other dielectric substances that are usually used in the manufacture of a semiconductor device, such as SiN and SiON, may be employed instead.

The surface relief structure portion 205 is formed by etching a ring-shaped groove that has, for example, an inside diameter of 4 μm and an outside diameter of 9 μm.

At this point, a post having a diameter of 4 μm is formed from the first dielectric film 203. The trench portion 204 which is formed with use of the same mask and which defines the mesa structure is formed by etching a groove that has, for example, an inside diameter of 27 μm and an outside diameter of 40 μm.

At this point, a post having a diameter of 27 μm is formed from the first dielectric film 203. The groove pattern for the surface relief structure described above is formed concentrically in the post where the trench portion 204 is formed. The relative positions of the surface relief structure and the mesa structure within the plane are thus uniquely determined.

The surface relief structure size given here is an example, and the surface relief structure may have a different size.

The surface relief structure size is determined by the relation with the size of the current confinement portion 105, and by the height of the surface relief structure described above.

The diameter of the surface relief structure may also be determined by what characteristics are required of the surface-emitting laser, such as setting the diameter of the surface relief structure small to enhance the effect of suppressing high-order transverse mode more effectively and large to reduce the effect of suppressing high-order transverse mode.

For instance, the diameter of the surface relief structure is set large when a part of the current injection region is allocated for the single transverse mode.

After the first dielectric film 203 is patterned, GaAS of the first semiconductor layer 111 is etched by wet etching which is controlled in a manner that leaves the second semiconductor layer 112 under GaAs.

In the wet etching, if the second semiconductor layer 112 is made from AlGaAs (GaAs containing Al) and the etchant used is a citric acid-based aqueous solution, $Al_yGa_{1-y}As$ (y>0) acts as an etching stop layer. The GaAs layer of the first semiconductor layer can thus be removed without etching away the second semiconductor layer 112.

The citric acid-based etchant can be, for example, an aqueous solution obtained by preparing A, which is a mixture of citric acid monohydrate and water having a weight ratio of 1:1, and mixing A, hydrogen peroxide solution, and water at a volume ratio of 2:60:250 (A/hydrogen peroxide solution/water).

An experiment conducted by the inventors of the present invention has confirmed that this etchant etches GaAs at an etching rate of 2 nm/second or higher, and etches $Al_{0.5}Ga_{0.5}As$ at an etching rate of lower than 0.1 nm/second.

Figure 3C:
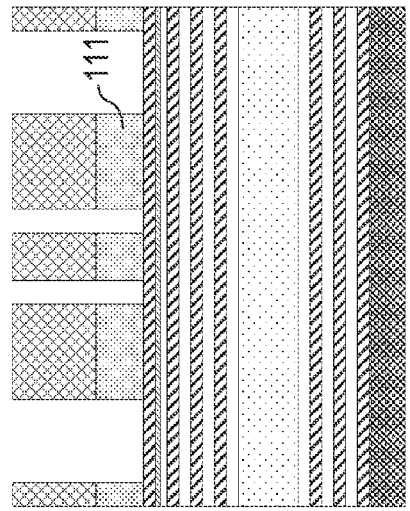
FIG. 3C is a process step diagram illustrating a step in the method of manufacturing the surface-emitting laser with the surface relief structure according to the first embodiment of the present invention.

With the citric-based etchant, the etching selectivity is 20 or higher for the two materials, $Al_{0.5}Ga_{0.5}As$ acts as an etching stop layer, and $Al_{0.5}Ga_{0.5}As$ of the high refractive index layer remains after the etching (FIG. 3C).

A second dielectric film 206 is formed next on the entire wafer. After that, a photoresist pattern 208 is formed by photolithography so as to cover the surface relief portion, and wet etching is performed to remove the second dielectric film 206 that has been formed in the trench portion 204.

The first dielectric film 203 is desirably thicker than the second dielectric film 206 to a degree that prevents the removal of the first dielectric film 203 which has been patterned by self-alignment when the second dielectric film 206 is removed from the trench portion 204 (FIG. 3D).

The second dielectric film 206 may be made from the same material as or a different material than the first dielectric film 203. If the material chosen for the second dielectric film 206 can be etched by the same etchant that is used to etch the first dielectric film 203, the first and second dielectric films can be removed later in the same dielectric film removing step, which helps to reduce the number of process steps.

For example, when SiO is used for the first dielectric film 203, the second dielectric film 206, too, may be formed from SiO. Similarly, SiON or SiN may be used for both of the first and second dielectric films.

In the case of these materials, buffered hydrofluoric acid can be used as an etchant.

Figure 4A:
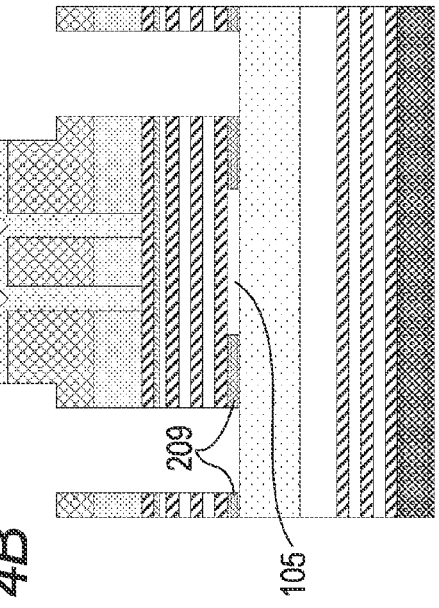
FIG. 4A is a process step diagram illustrating a step that follows the steps of FIGS. 3A, 3B, 3C and 3D in the method of manufacturing the surface-emitting laser with the surface relief structure according to the first embodiment of the present invention.

After that, the upper DBR in the trench portion 204 is etched by dry etching until the selective oxidation layer 207 is exposed, to thereby form the mesa structure (FIG. 4A).

For example, in the dry etching, reactive ion etching (RIE) using a mixture gas of $SiCl_4$ and Ar may be used to etch the GaAs-based materials.

The photoresist is removed next by ashing with use of oxygen plasma.

During the ashing, the presence of the second dielectric film 206 prevents damage to the second semiconductor layer 112 that is exposed in the surface relief structure portion.

Although the removal of the topmost layer of the DBR can be prevented without the second dielectric film 206 in some cases by adjusting the time and intensity of oxygen plasma asking, it is desirable to provide the second dielectric film 206 considering the in-plane distribution and margin of the process.

Figure 4B:
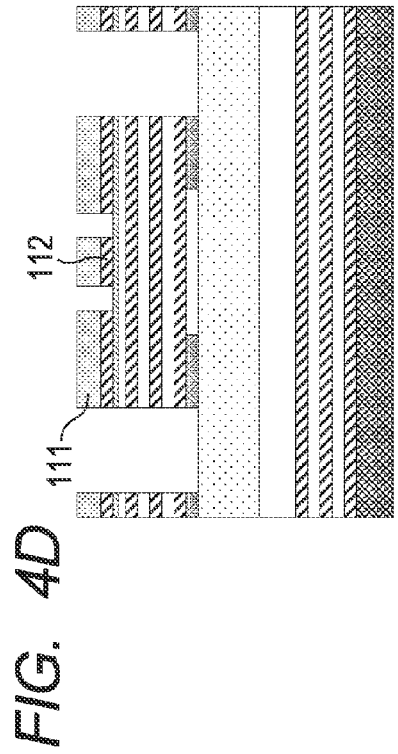
FIG. 4B is a process step diagram illustrating a step that follows the steps of FIGS. 3A, 3B, 3C and 3D in the method of manufacturing the surface-emitting laser with the surface relief structure according to the first embodiment of the present invention.

Next, the selective oxidation layer 207 exposed by the dry etching is selectively oxidized from the side walls of the mesa structure, to thereby form the current confinement portion 105 (FIG. 4B). Denoted by 209 are oxidized portions.

This selective oxidation is accomplished by, for example, putting the wafer in a furnace which has been heated to 400° C. and introducing water vapor into the furnace for thirty minutes.

At a temperature this high, desorption of arsenic atoms from GaAs and AlGaAs causes damage in some cases. It is therefore important to cover the semiconductor surface with a dielectric film in the selective oxidation.

If a range of the selective oxidation is 10.75 μm in the selective oxidation step, the diameter of the current confinement portion 105 is 5.5 μm because the mesa structure formed in the step of FIG. 3B has a diameter of 27 μm.

Figure 4C:
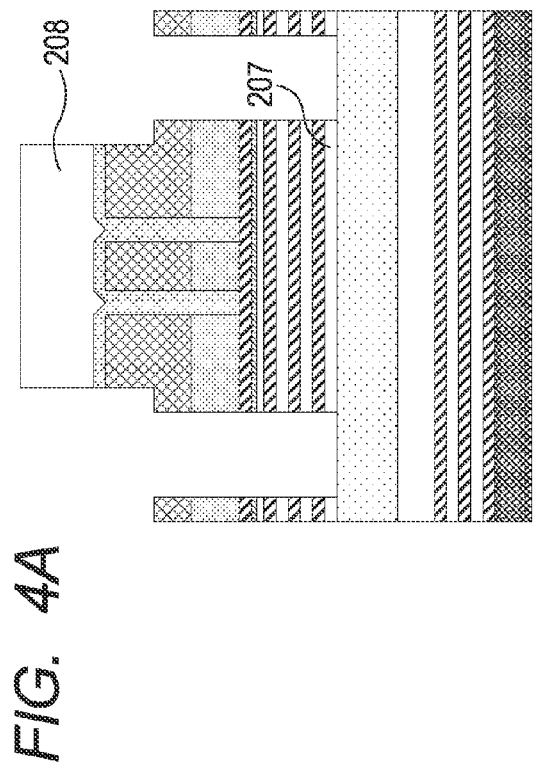
FIG. 4C is a process step diagram illustrating a step that follows the steps of FIGS. 3A, 3B, 3C and 3D in the method of manufacturing the surface-emitting laser with the surface relief structure according to the first embodiment of the present invention.

The first dielectric film 203 and the second dielectric film 206 are removed next (FIG. 4C).

In the case where the dielectric films are made from SiO, SiON, or SiN, for example, buffered hydrofluoric acid can be used as an etchant.

When the DBR is made from AlGaAs, buffered hydrofluoric acid etches the DBR from its side walls and may cause the mesa structure to collapse.

In such cases, the dielectric films may be etched after the side walls of the DBR are protected with a photoresist.

Figure 4D:
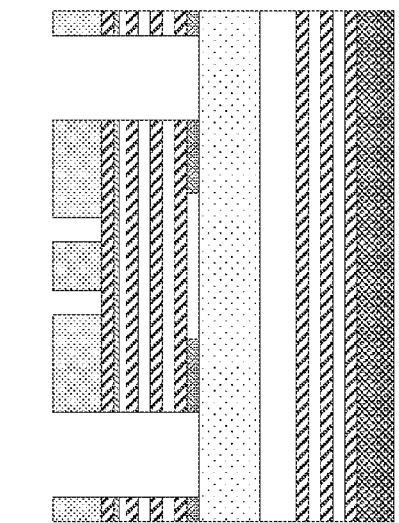
FIG. 4D is a process step diagram illustrating a step that follows the steps of FIGS. 3A, 3B, 3C and 3D in the method of manufacturing the surface-emitting laser with the surface relief structure according to the first embodiment of the present invention.

Next, the second semiconductor layer 112 which is the topmost layer of the DBR is etched with the first semiconductor layer 111 which is the contact layer as an etching mask, to thereby expose the bottom face of the surface relief structure (FIG. 4D).

The etching of the second semiconductor layer 112 preferably uses an etchant that has a high etching selectivity for the contact layer and the second semiconductor layer 112. Other etchants may also be used as long as the contact layer is not removed completely in the time it takes for the etchant to etch away the second semiconductor layer 112.

For example, a phosphoric acid-based aqueous solution can be used as an etchant in this step.

According to an experiment conducted by the inventors of the present invention, a phosphoric acid aqueous solution that was prepared by mixing phosphoric acid (content: 85%), hydrogen peroxide solution, and water at a volume ratio of 4:1:90 (phosphoric acid/hydrogen peroxide solution/water) etched GaAs at an etching rate of 0.6 nm/second and etched $Al_{0.5}Ga_{0.5}As$ at an etching rate of 1.1 nm/second.

This etchant does not have a high etching selectivity for GaAs and AlGaAs, but it is not a problem if the thickness of the GaAs layer of the contact layer is set to, for example, 200 nm.

In the case where the VCSEL oscillates at 680 nm which is in the red light range, and the high refractive index layer 207 of the second semiconductor layer 112 is made from $Al_{0.5}Ga_{0.5}As$, the refractive index of the second semiconductor layer 112 is approximately 3.46 and the thickness $\lambda/4n$ is approximately 49.1 nm.

Etching this second semiconductor layer 112 with the phosphoric acid-based etchant described above takes 44.6 seconds, and the thickness of the GaAs layer that is etched in that time is 26.7 nm. Even when the etching time is prolonged by 20 seconds by assuming that there are in-plane distributions in terms of etching and the thickness of the high refractive index layer 207, the GaAs layer is etched in the thickness direction by approximately 39 nm and is not removed completely.

By forming the GaAs layer of the contact layer thick in this way, low etching selectivity does not hinder this step.

The etchant used here needs to be one that allows the third semiconductor layer 113 to act as an etching stop layer for stopping the etching of the second semiconductor layer 112.

In the case of the phosphoric acid-based etchant described above, AlGaInP, specifically, $(Al_{0.5}Ga_{0.5})_{0.5}In_{0.5}P$ or the like, can be used as a material that allows the third semiconductor layer 113 to function as an etching stop layer.

Figure 5A:
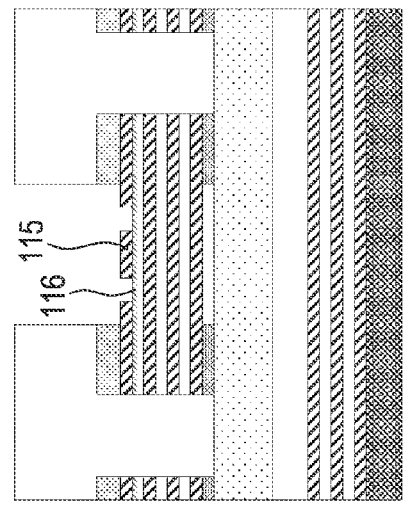
FIG. 5A is a process step diagram illustrating a step that follows the steps of FIGS. 4A, 4B, 4C and 4D in the method of manufacturing the surface-emitting laser with the surface relief structure according to the first embodiment of the present invention.

After that, by photolithography, a contact portion on the perimeter side of the surface relief bottom 116 (the opposite side from the top face of the surface relief structure) which serves as the contact portion 110 is protected, and a photoresist pattern 210 is formed in a manner that exposes the surface relief structure portion 205 (FIG. 5A).

Figure 5B:
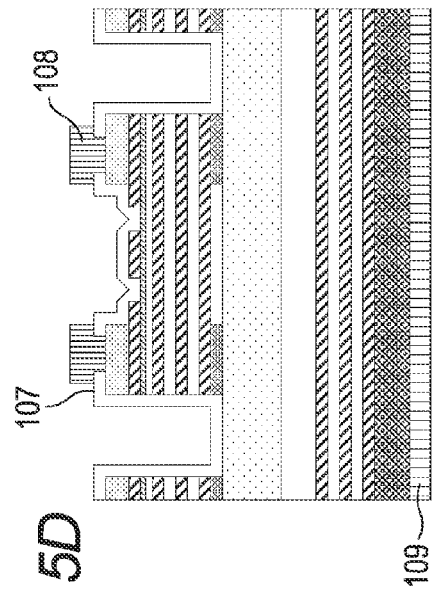
FIG. 5B is a process step diagram illustrating a step that follows the steps of FIGS. 4A, 4B, 4C and 4D in the method of manufacturing the surface-emitting laser with the surface relief structure according to the first embodiment of the present invention.
Figure 5C:
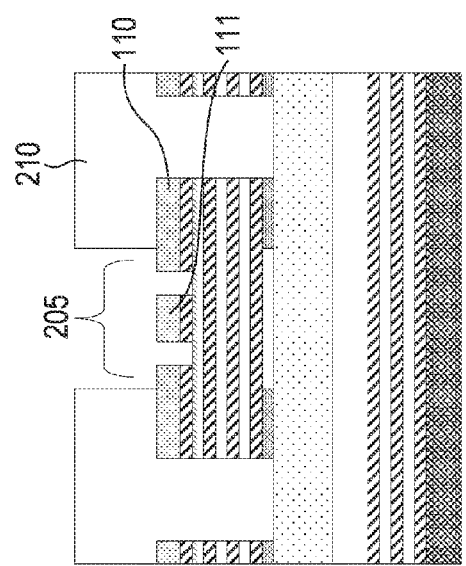
FIG. 5C is a process step diagram illustrating a step that follows the steps of FIGS. 4A, 4B, 4C and 4D in the method of manufacturing the surface-emitting laser with the surface relief structure according to the first embodiment of the present invention.

The photoresist pattern is used as a mask to etch the contact portion (first semiconductor layer) of the surface relief structure and expose the top face of the surface relief structure (FIG. 5B).

By using the etchants that allow the second semiconductor layer 112 and the third semiconductor layer 113 to function as etching stop layers in this manner, the top face and the bottom face of the surface relief structure can both be formed on boundaries defined in crystal growth.

With the top face and the bottom face of the surface relief structure both formed on boundaries that are defined in crystal growth in the manner described above, unstableness in the manufacture of a surface relief structure due to surface roughness, shaving, and damage caused in the process of manufacture is eliminated.

This embodiment may be structured to avoid the etching of the first semiconductor layer by satisfying a relation $a \times x > b \times y$ when the etching rate of the first semiconductor layer is given as a, the thickness of the first semiconductor layer is given as x, the etching rate of the second semiconductor layer is given as b, and the thickness of the second semiconductor layer is given as y.

In this embodiment, the contact portion may be protected immediately before the step of exposing the top face of the surface relief structure or immediately before the step of exposing the bottom face of the surface relief structure.

Figure 5D:
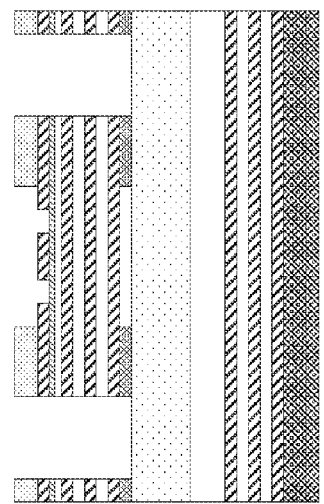
FIG. 5D is a process step diagram illustrating a step that follows the steps of FIGS. 4A, 4B, 4C and 4D in the method of manufacturing the surface-emitting laser with the surface relief structure according to the first embodiment of the present invention.

After that, the photoresist is removed (FIG. 5C), the entire wafer is covered with an insulating film, the insulating film is removed from a part of the contact portion 110 in order to lead out the electrode, metal is deposited by evaporation, and metal is also deposited by evaporation on the rear surface of the substrate. The device is thus completed (FIG. 5D). The insulating film, which covers the surface relief structure as well, is desirably formed to a thickness of $\lambda/2n$ (n represents the refractive index of the material) in order to avoid changing the reflectance of the surface-emitting laser. For example, in the case where the insulating film is made from SiO and has a refractive index of 1.54, and the laser oscillates at 680 nm which is in the red light range, the thickness $\lambda/2n$ is approximately 220 nm. The insulating film may also be formed from other materials that are usually used as an insulating film in a semiconductor device, such as $SiO_2$, SiON, and SiN.

When the insulating film is made from SiO as in this embodiment, buffered hydrofluoric acid can be used as an etchant.

In this embodiment, when the upper DBR and the contact layer are formed from p-type semiconductors and the lower DBR and the substrate are formed from n-type semiconductors, the upper electrode and the lower electrode can respectively be a layered structure of titanium and gold and a layered structure of a gold-germanium alloy, nickel, and gold.

After the steps of forming the top face and the bottom face of the surface relief structure, the subsequent steps do not include etching that is performed with the semiconductor surfaces of the surface relief structure exposed, nor a similarly damaging process, and the device is thus completed without allowing damage to the surfaces of the surface relief structure.

Through the steps described above, a surface relief structure that retains in a stable manner boundaries formed in crystal growth can be formed, and the resultant surface-emitting laser is reduced in manufacture fluctuations and oscillates in a single fundamental transverse mode.

This embodiment has described a method of manufacturing a surface-emitting laser which is a single device. However, the manufacturing method described above is also applicable to an array in which multiple single surface-emitting laser devices are provided.

Second Embodiment

A method of manufacturing a surface-emitting laser according to a second embodiment of the present invention is described.

Referring to FIGS. 6A to 6D, 7A to 7D, and 8A to 8C, this embodiment describes a method of manufacturing a surface-emitting laser that has a convex surface relief structure as in the first embodiment.

A wafer of this embodiment is obtained by further forming a fifth semiconductor layer 301 on the contact layer of the wafer of the first embodiment from the same material as that of the second semiconductor layer.

The fifth semiconductor layer 301 is desirably thicker than the second semiconductor layer 112 for reasons described later.

First, photolithography is performed on the wafer described above to separate the contact portion 110 and the surface relief structure portion 205 from each other. Next, a photoresist pattern 211 is used as an etching mask to etch the fifth semiconductor layer 301 by wet etching (FIG. 6B).

The fifth semiconductor layer 301 in this embodiment is formed from $Al_{0.5}Ga_{0.5}As$, which is the same material that is used for the second semiconductor layer in the first embodiment.

This etching uses the phosphoric acid-based etchant of the first embodiment.

The fifth semiconductor layer 301 has a thickness of 150 nm as described later, and takes 137 seconds to be etched.

The etching is continued for 20 seconds more by taking into account the in-plane distributions. As a result, the first semiconductor layer is etched as well, but is not removed completely if the first semiconductor layer has a thickness of 200 nm as described later.

Through this step, an etching mask used for the removal of the first semiconductor layer 111 in a subsequent step (FIG. 8B) is cut in the in-plane direction.

The first dielectric film 203 is formed next as an etching mask (FIG. 6C).

Figure 7B:
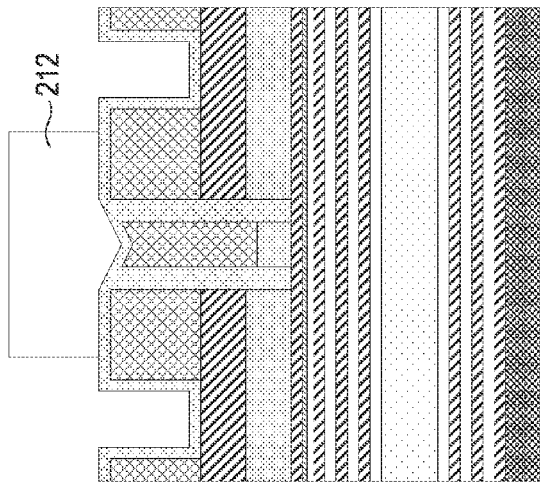
FIG. 7B is a process step diagram illustrating a step that follows the steps of FIGS. 6A, 6B, 6C and 6D in the method of manufacturing the surface-emitting laser with the surface relief structure according to the second embodiment of the present invention.
Figure 7A:
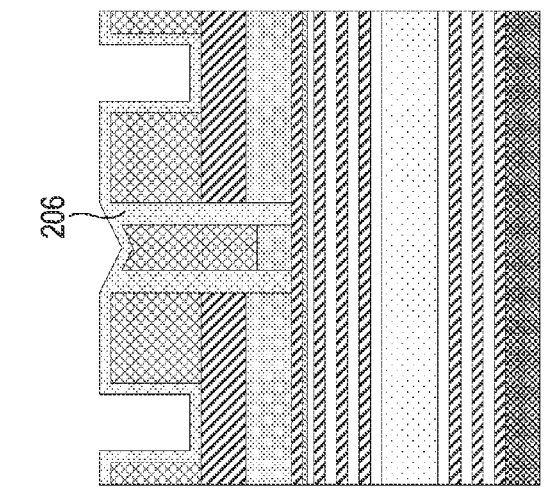
FIG. 7A is a process step diagram illustrating a step that follows the steps of FIGS. 6A, 6B, 6C and 6D in the method of manufacturing the surface-emitting laser with the surface relief structure according to the second embodiment of the present invention.

After that, as in the first embodiment, the first dielectric film 203 is patterned by photolithography and wet etching (FIG. 6D), and the surface relief structure portion 205 is protected with the second dielectric film 206 and a photoresist 212 (FIGS. 7A and 7B).

Figure 7D:
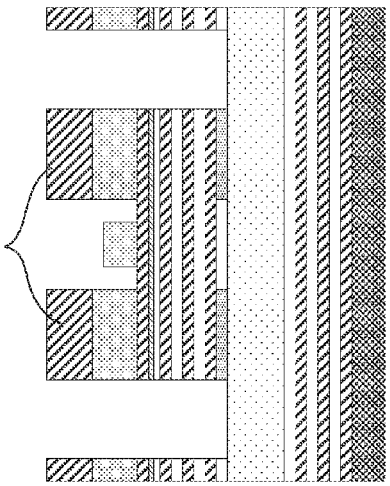
FIG. 7D is a process step diagram illustrating a step that follows the steps of FIGS. 6A, 6B, 6C and 6D in the method of manufacturing the surface-emitting laser with the surface relief structure according to the second embodiment of the present invention.
Figure 7C:
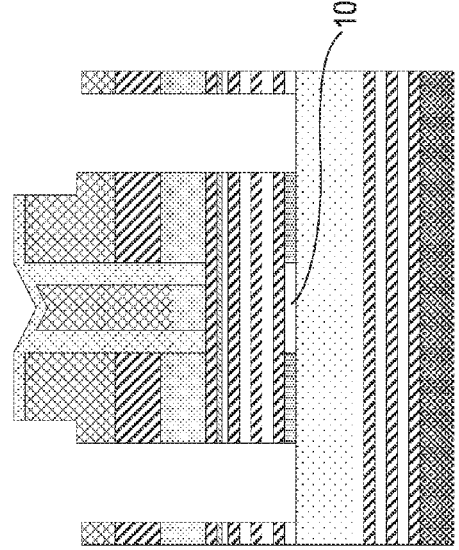
FIG. 7C is a process step diagram illustrating a step that follows the steps of FIGS. 6A, 6B, 6C and 6D in the method of manufacturing the surface-emitting laser with the surface relief structure according to the second embodiment of the present invention.

A mesa structure is then formed by dry etching, selective oxidation is performed (FIG. 7C), and the first dielectric film 203 and the second dielectric film 206 are removed (FIG. 7D).

Figure 8A:
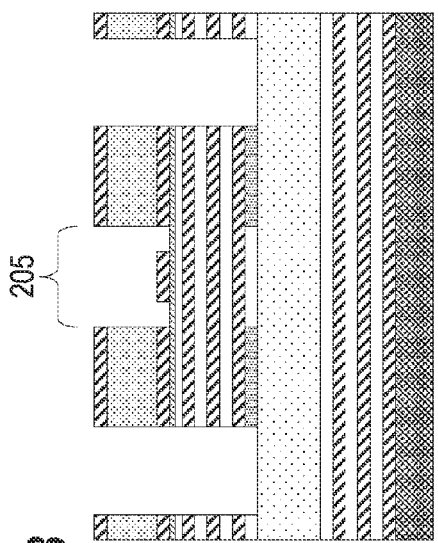
FIG. 8A is a process step diagram illustrating a step that follows the steps of FIGS. 7A, 7B, 7C and 7D in the method of manufacturing the surface-emitting laser with the surface relief structure according to the second embodiment of the present invention.

Next, the second semiconductor layer 112 which is the topmost layer of the DBR is etched with the fifth semiconductor layer 301 and the first semiconductor layer 111 which is the contact layer as etching masks (FIG. 8A).

The fifth semiconductor layer 301 is simultaneously etched because the second semiconductor layer 112 and the fifth semiconductor layer 301 are formed from the same material.

It is therefore important to form the fifth semiconductor layer 301 thicker than the second semiconductor layer 112.

For example, a phosphoric acid-based etchant is used in this etching. According to an experiment conducted by the inventors of the present invention, a phosphoric acid aqueous solution that was prepared by mixing phosphoric acid (content: 85%), hydrogen peroxide solution, and water at a volume ratio of 4:1:90 (phosphoric acid/hydrogen peroxide solution/water) etched GaAs at an etching rate of 0.6 nm/second and etched $Al_{0.5}Ga_{0.5}As$ at an etching rate of 1.1 nm/second.

In this embodiment, $Al_{0.5}Ga_{0.5}As$ is used for the fifth semiconductor layer 301 and the second semiconductor layer 112, and GaAs is used for the first semiconductor layer 111 which is the contact layer.

When the thickness of the second semiconductor layer 112 is $\lambda/4n$, which is approximately 49.1 nm in this case, it takes approximately 44.6 seconds to etch the second semiconductor layer 112. Based on this value, the thickness of the GaAs layer is set to 200 nm as in the first embodiment.

It is also essential for the $Al_{0.5}Ga_{0.5}As$ layer of the fifth semiconductor layer 301 to have a thickness of 49.1 nm or more. The film uniformity required of an etching mask which is described later and the in-plane distribution of etching are also taken into account, and the thickness of the $Al_{0.5}Ga_{0.5}As$ layer is therefore set to 150 nm.

Setting the thickness of the second semiconductor layer to $\lambda/4n$ is merely an example as described in the first embodiment, and the second semiconductor layer can be set to a thickness that is determined by characteristics required of the surface-emitting laser.

Figure 8B:
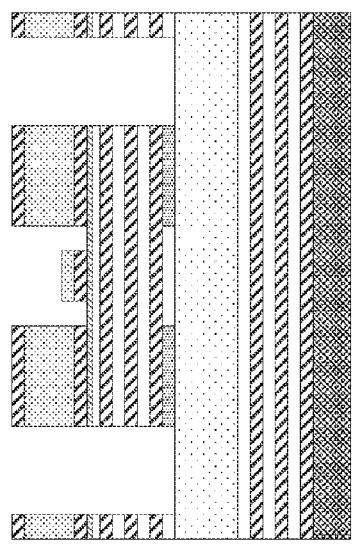
FIG. 8B is a process step diagram illustrating a step that follows the steps of FIGS. 7A, 7B, 7C and 7D in the method of manufacturing the surface-emitting laser with the surface relief structure according to the second embodiment of the present invention.

After the second semiconductor layer 112 is etched, the first semiconductor layer 111 that is the contact layer exposed on the top face of the surface relief structure 205 is removed (FIG. 8B). By using an etchant that allows the second semiconductor layer 112 to function as an etching stop layer in this etching, a boundary formed through crystal growth can be utilized as the top face of the surface relief structure.

In this step, the fifth semiconductor layer 301 which has been patterned in the step of FIG. 6B and which has been used as one of the etching masks in the preceding step protects the contact portion 119. As a result, only the first semiconductor layer 111 that is on the top face of the surface relief structure is etched without etching the first semiconductor layer 111 that is the contact portion 119.

A material that allows the third semiconductor layer to function as an etching stop layer may be selected as in the first embodiment to utilize a boundary formed through crystal growth as the bottom face of the surface relief structure, too. The third semiconductor layer in this embodiment is formed from $(Al_{0.5}Ga_{0.5})_{0.5}In_{0.5}P$ as in the first embodiment.

This embodiment may be structured to satisfy a relation c/v>d/w when the etching rate of the fifth semiconductor layer is given as c, the thickness of the fifth semiconductor layer is given as v, the etching rate of the second semiconductor layer is given as d, and the thickness of the second semiconductor layer is given as w.

After that, a layer of SiN is formed as the insulating film 107 to a thickness of $\lambda/2n$, and only a part of the insulating film 107 that is on the contact portion is etched.

Figure 8C:
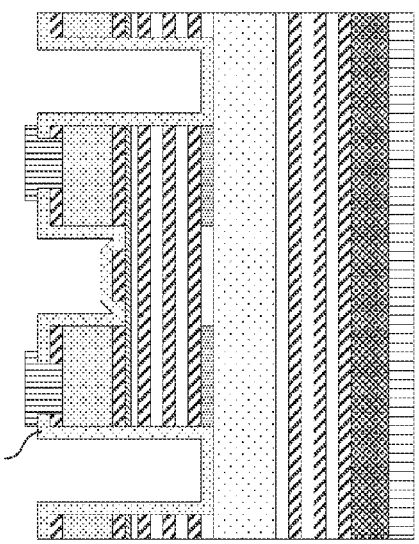
FIG. 8C is a process step diagram illustrating a step that follows the steps of FIGS. 7A, 7B, 7C and 7D in the method of manufacturing the surface-emitting laser with the surface relief structure according to the second embodiment of the present invention.

The insulating film 107 is next used as an etching mask to etch the remaining fifth semiconductor layer 301 and expose the first semiconductor layer 111 which is the contact layer. A metal film to serve an electrode is formed in the exposed place and another metal film is formed on the rear surface of the substrate to complete the manufacture of the surface-emitting laser (FIG. 8C).

The surface-emitting laser manufactured in this manner has crystal interfaces formed through crystal growth on the top face and the bottom face of a surface relief structure, which is positioned with respect to a current confinement structure, and oscillates in a single fundamental transverse mode in a stable manner.

In this embodiment, unlike the first embodiment, the removal of a photoresist after the surface relief structure is formed is not performed with the surface relief structure exposed. Damage to the surface relief structure is therefore reduced even more. Consequently, the surface relief structure is formed in a more stable manner and the manufacture yield of a surface-emitting laser that oscillates in a single transverse mode is improved.

This embodiment has described a method of manufacturing a surface-emitting laser which is a single device. However, the manufacturing method described above is also applicable to an array in which multiple single surface-emitting laser devices are provided.

Third Embodiment

Described next is a method of manufacturing a surface-emitting laser with a concave surface relief structure according to a third embodiment of the present invention.

Figure 9:
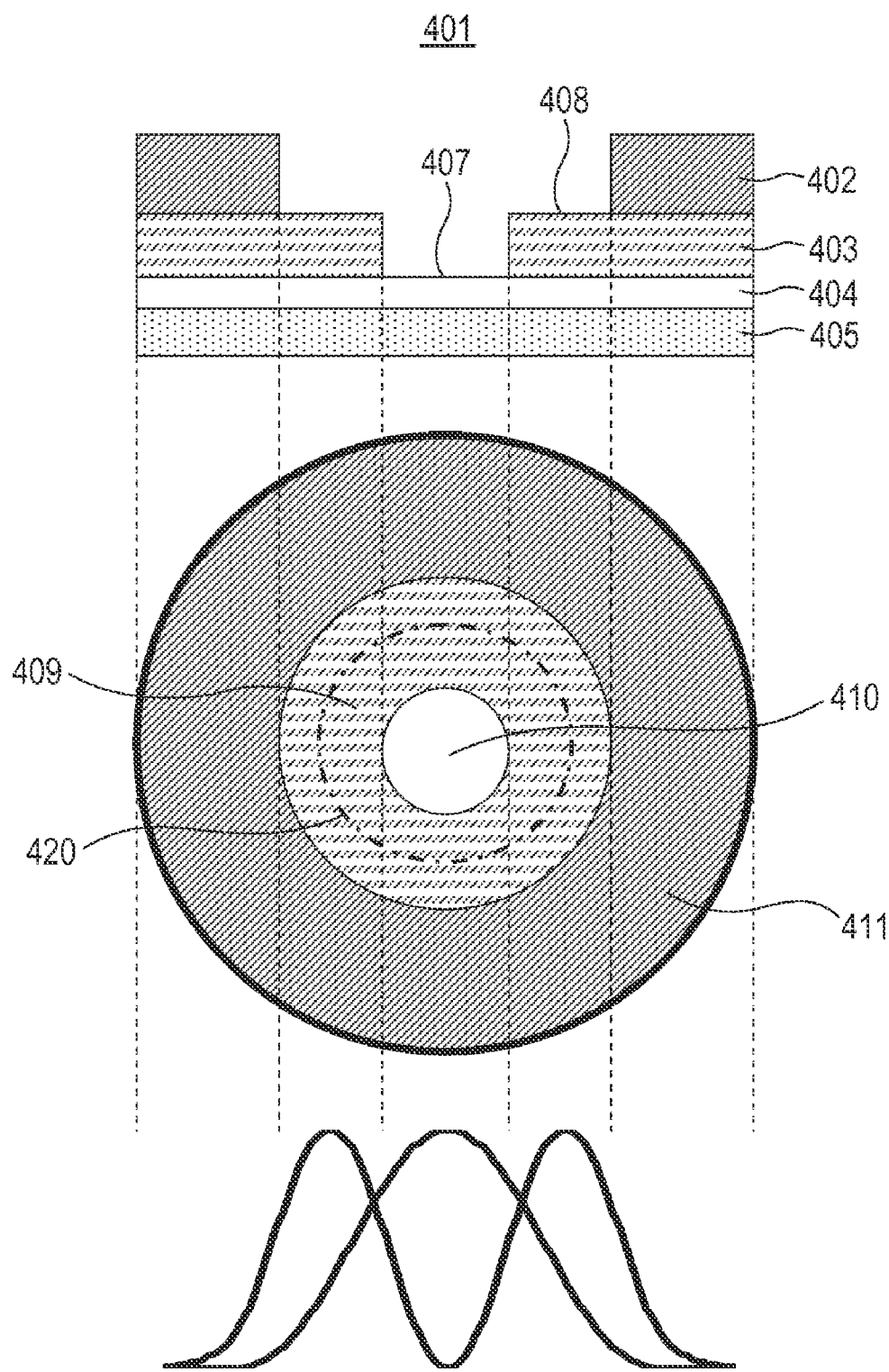
FIG. 9 is a diagram illustrating a surface relief structure of the surface-emitting laser according to the third embodiment of the present invention.

A surface relief structure 401, which has a different form from the surface relief structures of the first and second embodiments, is described in detail with reference to FIG. 9. FIG. 9 above is a sectional view of the surface relief structure 401 and FIG. 9 middle is a plan view of the surface relief structure 401 viewed from above. The concave structure of the surface relief structure 401 is formed from a second semiconductor layer 403. Hereinafter, a surface of the concave structure is referred to as surface relief top 408. At the center of the concave structure, the second semiconductor layer 403 is removed to expose a third semiconductor layer 404.

Hereinafter, the exposed surface is referred to as surface relief bottom 407. In this embodiment, the wafer is designed such that the surface relief top 408 serves as a low reflection region 409 which has a low reflectance whereas the surface relief bottom 407 serves as a high reflection region 410 which has a high reflectance.

The high reflection region 410 is formed in a manner that controls the position of the high reflection region 410 within the plane with respect to a current confinement portion. A contact portion 411 which is a layer necessary to allow a current to flow from an electrode is formed around the surface relief top 408. Denoted by 420 is the border of the current confinement portion.

The wafer structure of the surface-emitting laser manufactured in this embodiment is the same in terms of layer structure as the wafer structure of the second embodiment, except for an upper DBR 502 and layers that are formed on the upper DBR 502.

Specifically, the wafer structure of this embodiment is obtained by stacking a lower DBR, an active region, the upper DBR 502, a first semiconductor layer 402 which is a contact layer, and a fifth semiconductor layer 501 in order on a substrate.

The last three layers of the upper DBR 502 differ from those of the second embodiment. The surface-emitting laser structure is the same as in the first embodiment and the second embodiment, except for the surface relief structure portion.

Next, a method of manufacturing the surface-emitting laser according to this embodiment is described.

FIGS. 10A to 10D, 11A to 11D, and 12A to 12C are process step diagrams of this manufacturing method.

The upper DBR 502 of this embodiment is the same as the upper DBR of the second embodiment in that the high refractive index layers 207 and the low refractive index layers 206 are stacked alternately, and differs from the second embodiment in the composition of the last three layers. The rest of the third embodiment is the same as the second embodiment.

In this embodiment, the refractive indices n1 to n4 satisfy a relation n4>n3>n2<n1, and the reflectance is highest at the border between n3 and n2.

Specifically, the last three layers of the upper DBR 502 counted from the contact layer side are the second semiconductor layer 403, the third semiconductor layer 404, and a fourth semiconductor layer 405.

The fourth semiconductor layer 405 is formed from the same material as that of the high refractive index layers. The third semiconductor layer 404 is formed from a material that functions as an etching stop layer in the etching of the second semiconductor layer 403.

The second semiconductor layer 403 is formed from a material that is lower in refractive index than the fourth semiconductor layer 405 and the third semiconductor layer 404 (the third semiconductor layer 404 also needs to be formed from a material that is not etched when first and second dielectric films are removed).

The third semiconductor layer 404 is formed from a material whose refractive index is between the refractive index of the fourth semiconductor layer 405 and the refractive index of the second semiconductor layer 403.

Specifically, $Al_{0.5}Ga_{0.5}As$ can be used for the high refractive index layers 207, $Al_{0.9}Ga_{0.1}As$ can be used for the low refractive index layers 206, $Al_{0.5}Ga_{0.5}As$ can be used for the fourth semiconductor layer 405, $(Al_{0.5}Ga_{0.5})_{0.5}In_{0.5}P$ can be used for the third semiconductor layer 404, and $Al_{0.7}Ga_{0.25}As$ can be used for the second semiconductor layer 403.

The upper DBR 502 in this embodiment is designed to have the highest reflectance at the border between the third semiconductor layer 404 and the second semiconductor layer 403.

In order to make the last three layers of the upper DBR 502 consistent with their underlying DBR layers, the total thickness of the three layers, namely, the second semiconductor layer 403, the third semiconductor layer 404, and the fourth semiconductor layer 405, is preferably $\lambda/2n$ (n represents the refractive index of each material).

A GaAs layer is formed on this upper DBR 502 as the first semiconductor layer 402 which functions as a contact layer. An $Al_{0.75}Ga_{0.25}As$ layer is further formed on the first semiconductor layer 402 as the fifth semiconductor layer 501.

First, photolithography is performed on the wafer to separate a contact portion 503 and a surface relief structure portion 504 from each other.

Figure 10A:
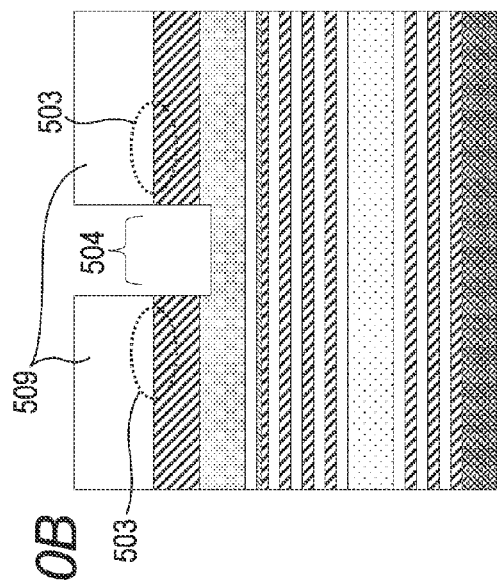
FIG. 10A is a process step diagram illustrating a step in a method of manufacturing the surface-emitting laser with the surface relief structure according to the third embodiment of the present invention.
Figure 10B:
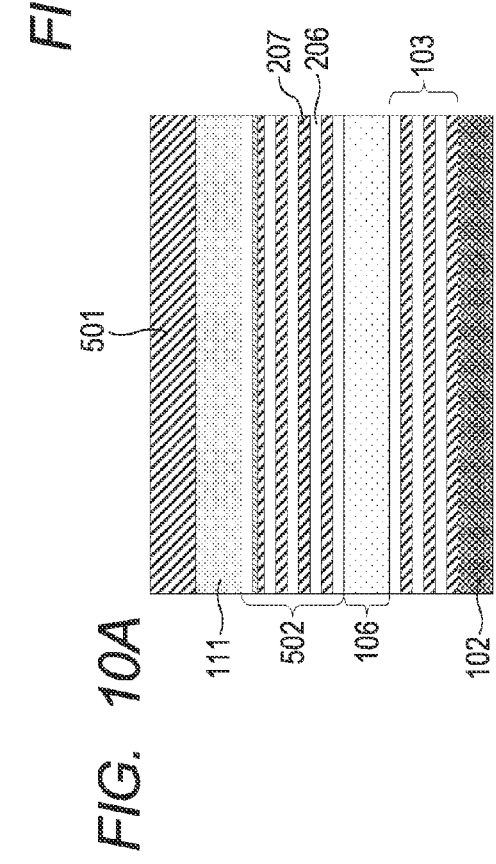
FIG. 10B is a process step diagram illustrating a step in the method of manufacturing the surface-emitting laser with the surface relief structure according to the third embodiment of the present invention.
Figure 10C:
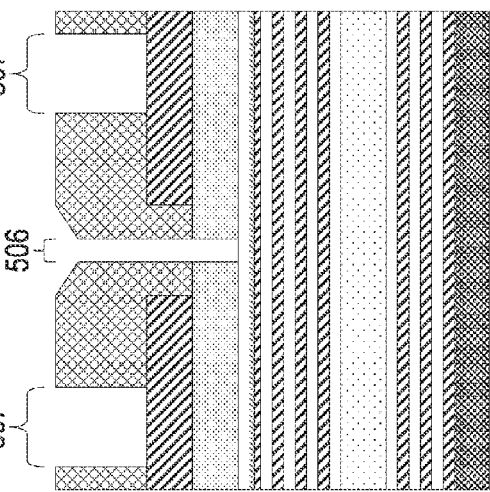
FIG. 10C is a process step diagram illustrating a step in the method of manufacturing the surface-emitting laser with the surface relief structure according to the third embodiment of the present invention.

Next, a photoresist pattern 509 is used as an etching mask to etch the fifth semiconductor layer 501 by wet etching in a hole pattern having a diameter of 10 μm (FIG. 10B).

Through this step, an etching mask used for the removal of the contact layer in a subsequent step (FIG. 12B) is cut in the in-plane direction.

After that, a first dielectric film 505 is formed in the same manner as in the first embodiment (FIG. 10C), and a surface relief hole 506 and a trench portion 507 are formed by photolithography and wet etching.

The surface relief structure of this embodiment has a concave shape and therefore the etched-out structure slightly differs from that of the first embodiment.

Specifically, a hole pattern having a diameter of, for example, 4 μm is etched out as the surface relief hole 506 and a groove having, for example, an inside diameter of 27 μm and an outside diameter of 40 μm is etched out as the trench portion 507. The hole pattern and the groove pattern are formed concentrically with the use of the same mask. The relative positions of the surface relief structure and the mesa structure within the plane are thus uniquely determined.

Figure 10D:
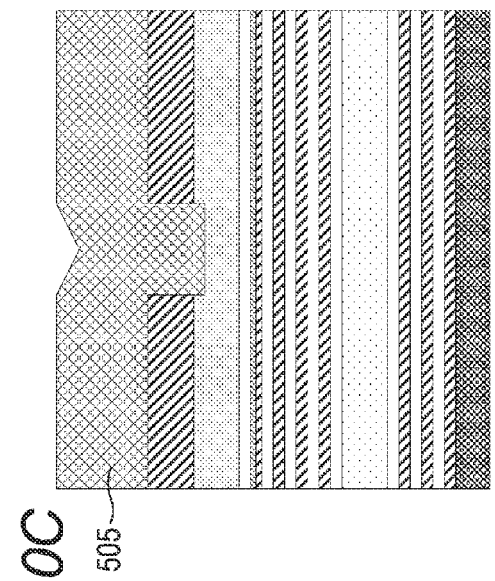
FIG. 10D is a process step diagram illustrating a step in the method of manufacturing the surface-emitting laser with the surface relief structure according to the third embodiment of the present invention.
Figure 11B:
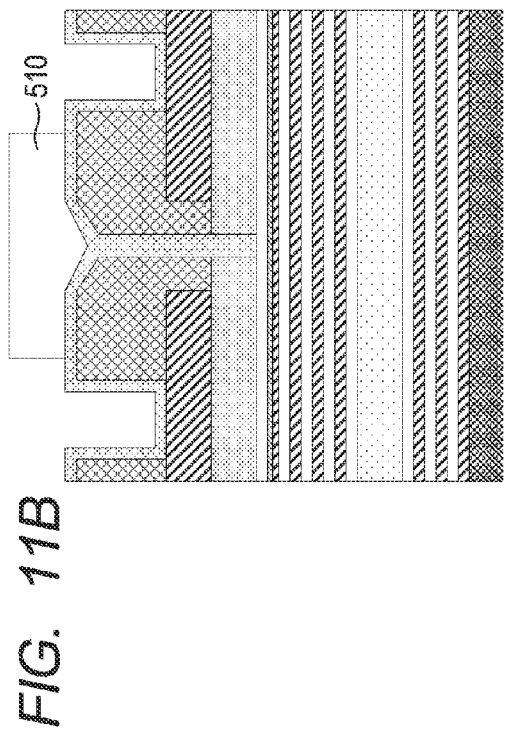
FIG. 11B is a process step diagram illustrating a step that follows the steps of FIGS. 10A, 10B, 10C and 10D in the method of manufacturing the surface-emitting laser with the surface relief structure according to the third embodiment of the present invention.
Figure 11D:
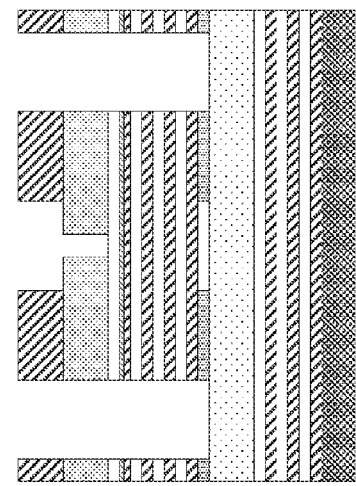
FIG. 11D is a process step diagram illustrating a step that follows the steps of FIGS. 10A, 10B, 10C and 10D in the method of manufacturing the surface-emitting laser with the surface relief structure according to the third embodiment of the present invention.
Figure 11A:
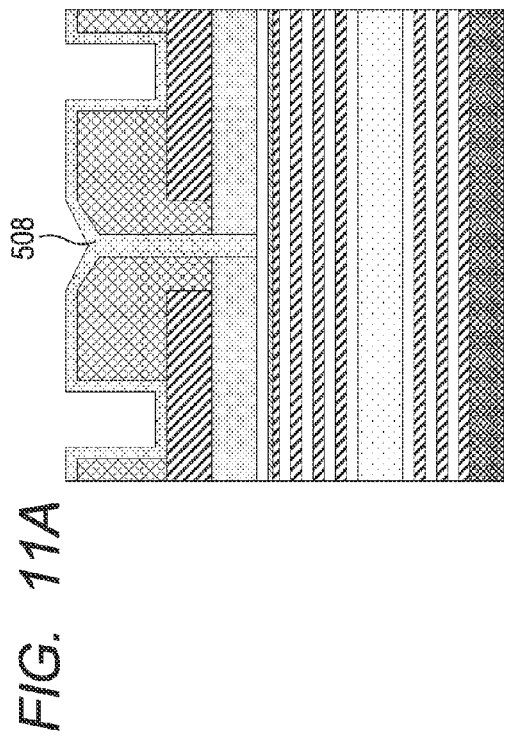
FIG. 11A is a process step diagram illustrating a step that follows the steps of FIGS. 10A, 10B, 10C and 10D in the method of manufacturing the surface-emitting laser with the surface relief structure according to the third embodiment of the present invention.
Figure 11C:
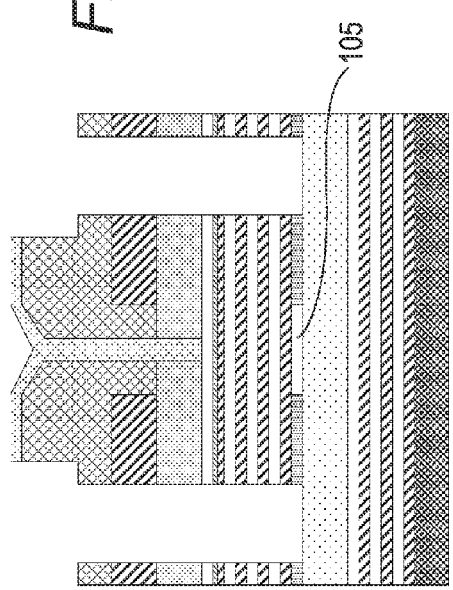
FIG. 11C is a process step diagram illustrating a step that follows the steps of FIGS. 10A, 10B, 10C and 10D in the method of manufacturing the surface-emitting laser with the surface relief structure according to the third embodiment of the present invention.

After that, the first semiconductor layer 402 is etched in the same manner as in the second embodiment (FIG. 10D), and the surface relief structure is protected with a second dielectric film 508 and a photoresist 510 (FIGS. 11A and 11B).

After that, the mesa structure is formed by dry etching, selective oxidation is performed (FIG. 11C), and the first dielectric film 505 and the second dielectric film 508 are removed (FIG. 11D).

Figure 12A:
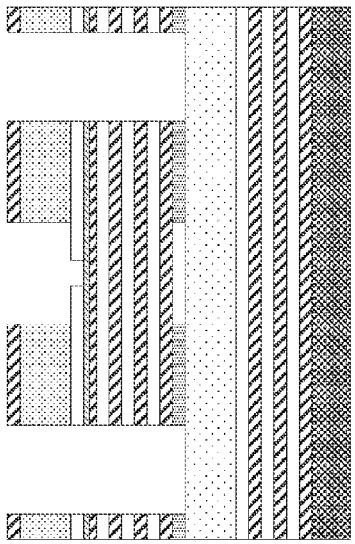
FIG. 12A is a process step diagram illustrating a step that follows the steps of FIGS. 11A, 11B, 11C and 11D in the method of manufacturing the surface-emitting laser with the surface relief structure according to the third embodiment of the present invention.
Figure 12B:
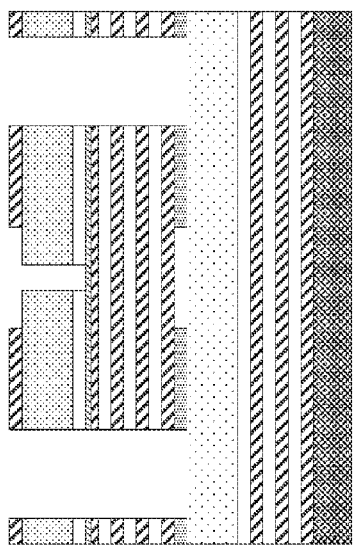
FIG. 12B is a process step diagram illustrating a step that follows the steps of FIGS. 11A, 11B, 11C and 11D in the method of manufacturing the surface-emitting laser with the surface relief structure according to the third embodiment of the present invention.

The second semiconductor layer 403 is subsequently etched (FIG. 12A), and the first semiconductor layer 402 is etched (FIG. 12B).

Figure 12C:
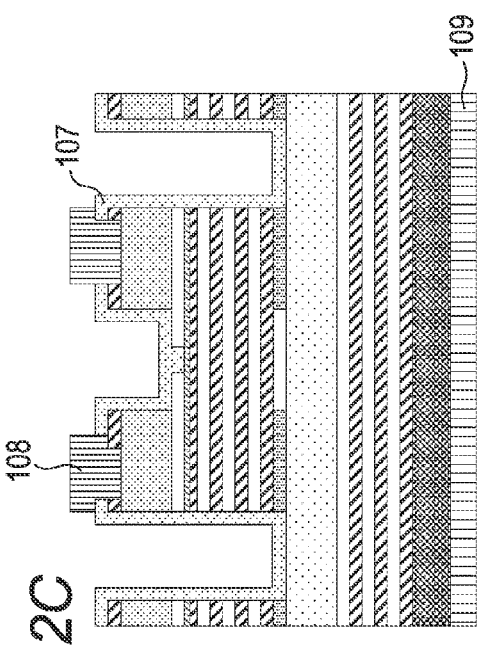
FIG. 12C is a process step diagram illustrating a step that follows the steps of FIGS. 11A, 11B, 11C and 11D in the method of manufacturing the surface-emitting laser with the surface relief structure according to the third embodiment of the present invention.

An insulating film is formed, the fifth semiconductor layer 501 is removed, and electrodes are formed, to thereby complete the manufacture of the surface-emitting laser (FIG. 12C).

In this embodiment, a concave surface relief structure is formed by giving the upper DBR 502 a different structure from that of the upper DBR of the second embodiment.

This embodiment has described a method of manufacturing a surface-emitting laser which is a single device. However, the manufacturing method described above is also applicable to an array in which multiple single surface-emitting laser devices are provided.

Fourth Embodiment

Described next is a method of manufacturing a surface-emitting laser with a concave surface relief structure according to a fourth embodiment of the present invention.

This embodiment relates to a method of manufacturing a surface-emitting laser with a concave surface relief structure similarly to that of the third embodiment. The wafer structure used in this embodiment is therefore the same as the wafer structure of the third embodiment, except that the fifth semiconductor layer 501 is not provided in this embodiment.

The manufacturing method of this embodiment is described below with reference to FIG. 9 and FIGS. 13A to 13D, 14A to 14D, and 15A to 15C.

This embodiment uses the wafer of the third embodiment, though the fifth semiconductor layer 501 is absent.

Specifically, the wafer of this embodiment is obtained by stacking a lower DBR, an active region, the upper DBR 502, and the first semiconductor layer 402 which is a contact layer, in order on a substrate, and the composition of the last three layers of the upper DBR 502 in this embodiment is the same as in the third embodiment.

Figure 13A:
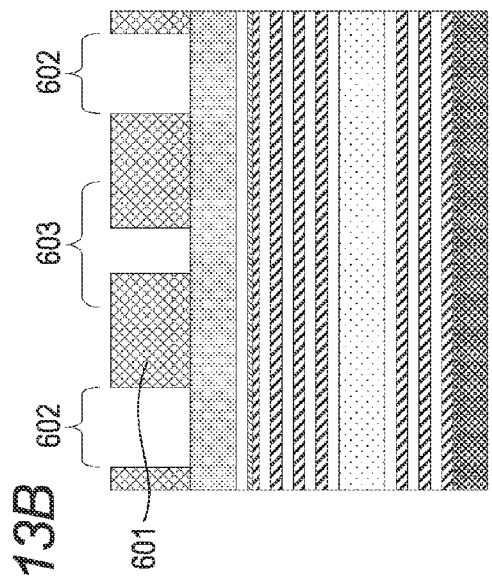
FIG. 13A is a process step diagram illustrating a step in a method of manufacturing a surface-emitting laser with the surface relief structure according to the fourth embodiment of the present invention.
Figure 13B:
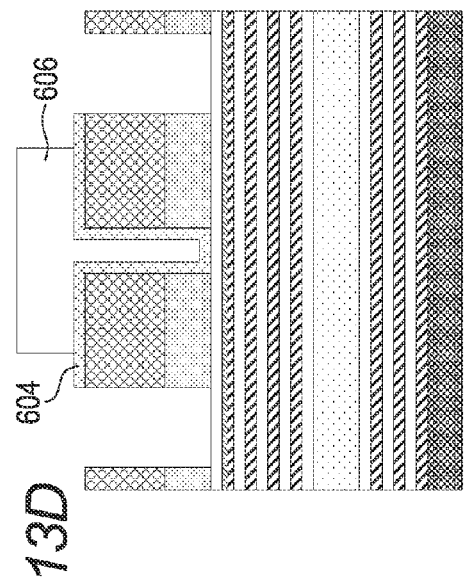
FIG. 13B is a process step diagram illustrating a step in the method of manufacturing the surface-emitting laser with the surface relief structure according to the fourth embodiment of the present invention.
Figure 13C:
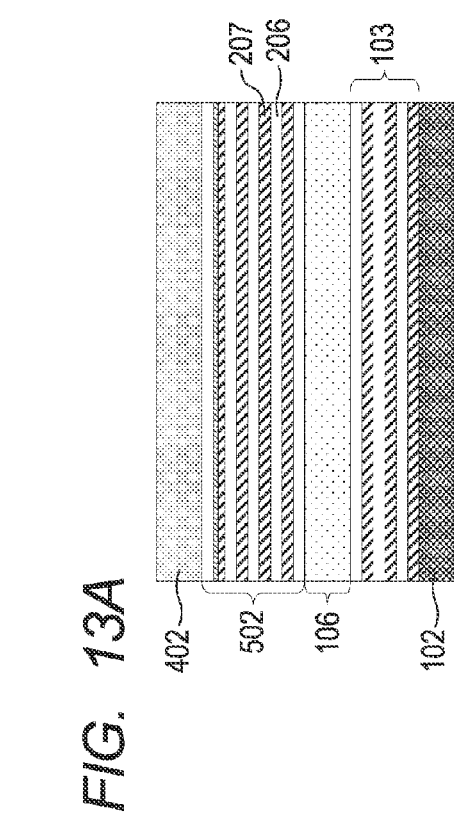
FIG. 13C is a process step diagram illustrating a step in the method of manufacturing the surface-emitting laser with the surface relief structure according to the fourth embodiment of the present invention.
Figure 13D:
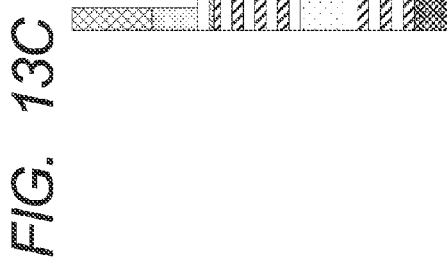
FIG. 13D is a process step diagram illustrating a step in the method of manufacturing the surface-emitting laser with the surface relief structure according to the fourth embodiment of the present invention.

On this wafer, a first dielectric film 601 is formed and a surface relief structure portion 603 and a trench portion 602 are formed by photolithography and wet etching as in the step of FIG. 10D and the subsequent steps of the third embodiment (FIG. 13B).

The surface relief structure portion and the trench portion at this point are structured in the same manner as in the third embodiment.

Figure 14A:
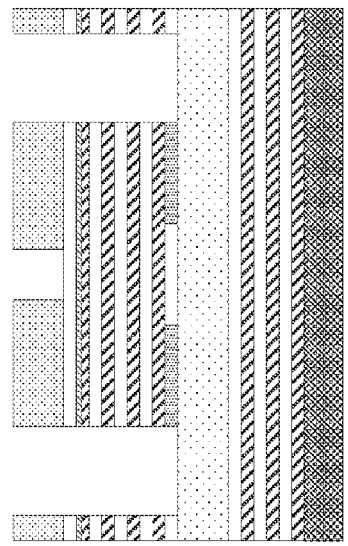
FIG. 14A is a process step diagram illustrating a step that follows the steps of FIGS. 13A, 13B, 13C and 13D in the method of manufacturing the surface-emitting laser with the surface relief structure according to the fourth embodiment of the present invention.

In subsequent steps, in the same manner as in the third embodiment, the first semiconductor layer 402 is etched (FIG. 13C), the surface relief structure is protected with a second dielectric film 604 and a photoresist 606 (FIG. 13D), the mesa structure is formed by dry etching, and selective oxidation is performed (FIG. 14A).

Figure 14B:
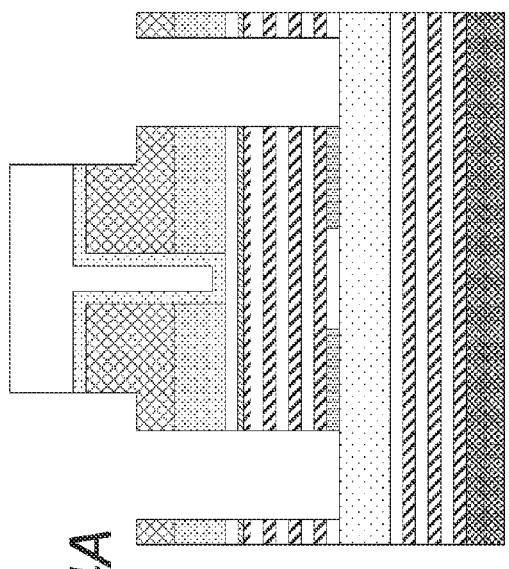
FIG. 14B is a process step diagram illustrating a step that follows the steps of FIGS. 13A, 13B, 13C and 13D in the method of manufacturing the surface-emitting laser with the surface relief structure according to the fourth embodiment of the present invention.

The first and second dielectric films are removed (FIG. 14B).

Steps that follow those steps are unique to this embodiment.

To summarize, a step of protecting the contact portion is performed after the selective oxidation step and before a step of exposing the top face of the surface relief structure in order to protect a region of the first semiconductor layer, which functions as the contact portion, with a third dielectric film.

Figure 14C:
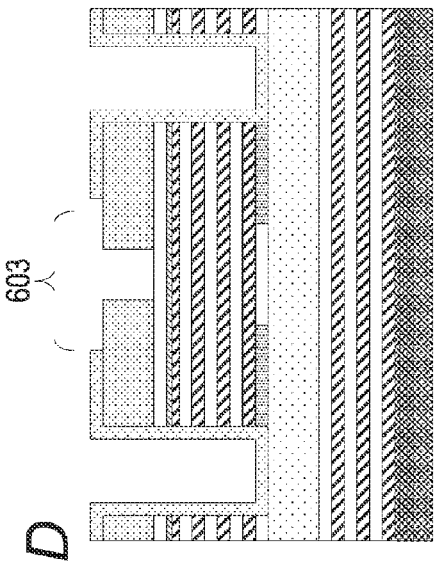
FIG. 14C is a process step diagram illustrating a step that follows the steps of FIGS. 13A, 13B, 13C and 13D in the method of manufacturing the surface-emitting laser with the surface relief structure according to the fourth embodiment of the present invention.

Specifically, a third dielectric film 605 is formed in a step subsequent to the step of FIG. 14B (FIG. 14C).

This dielectric film is formed from, for example, SiO$_2$, SiN, or SiON, or from other materials.

Figure 14D:
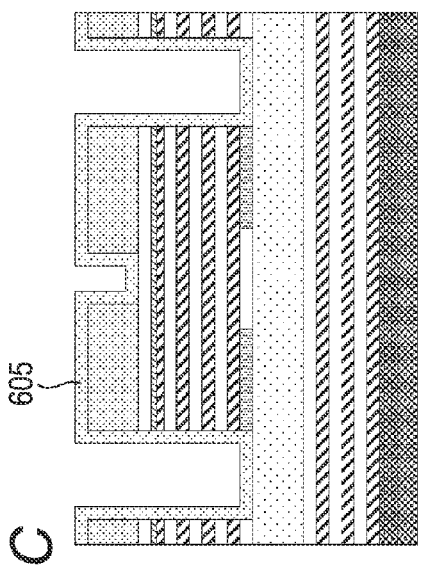
FIG. 14D is a process step diagram illustrating a step that follows the steps of FIGS. 13A, 13B, 13C and 13D in the method of manufacturing the surface-emitting laser with the surface relief structure according to the fourth embodiment of the present invention.

The third dielectric film 605 is patterned by photolithography and wet etching to expose the surface relief structure (FIG. 14D).

In the case where one of the materials given above is used for the third dielectric film 605, buffered hydrofluoric acid can be used as an etchant.

Next, the second semiconductor layer 403 is etched and the first semiconductor layer 402 is then etched as in the first, second, and third embodiments.

It is important that the third dielectric film 605 be not removed by the etchants used in those etching steps.

In the case of the material used in this embodiment, the citric acid-based etchant of the first embodiment does not etch the third dielectric film 605.

Figure 15B:
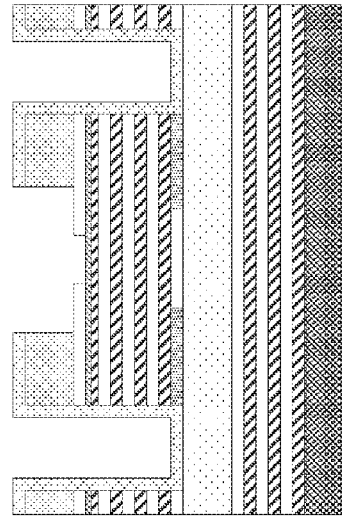
FIG. 15B is a process step diagram illustrating a step that follows the steps of FIGS. 14A, 14B, 14C and 14D in the method of manufacturing the surface-emitting laser with the surface relief structure according to the fourth embodiment of the present invention.
Figure 15A:
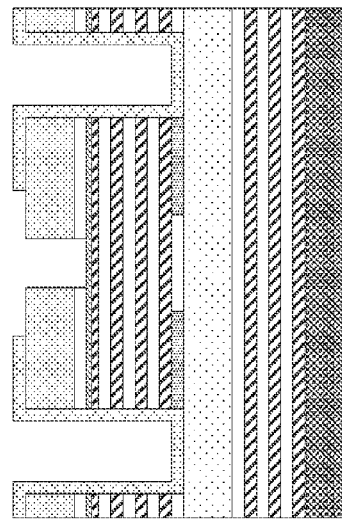
FIG. 15A is a process step diagram illustrating a step that follows the steps of FIGS. 14A, 14B, 14C and 14D in the method of manufacturing the surface-emitting laser with the surface relief structure according to the fourth embodiment of the present invention.
Figure 15C:
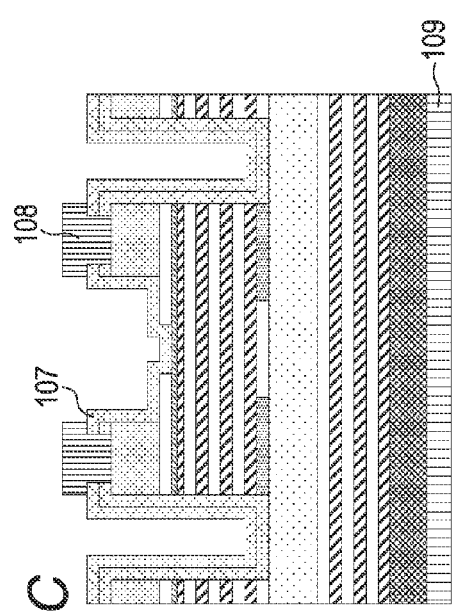
FIG. 15C is a process step diagram illustrating a step that follows the steps of FIGS. 14A, 14B, 14C and 14D in the method of manufacturing the surface-emitting laser with the surface relief structure according to the fourth embodiment of the present invention.

After that, an insulating film is formed, a part of the insulating film at which an electrode is formed is removed, and upper and lower electrodes are formed in the same manner as in the first embodiment. The surface-emitting laser is thus manufactured (FIGS. 15A to 15C).

This embodiment does not include a step of removing a photoresist after the surface relief structure is formed, unlike the first embodiment. Damage to the surface relief structure is therefore reduced even more.

In addition, unlike the second embodiment and the third embodiment, this embodiment can use the same etching mask for the removal of the insulating film from the contact portion in order to form the electrode and for the etching of the first semiconductor layer 111. This embodiment therefore requires one less wet etching step.

This embodiment has described a method of manufacturing a surface-emitting laser which is a single device. However, the manufacturing method described above is also applicable to an array in which multiple single surface-emitting laser devices are provided.

Fifth Embodiment

Figure 16A:
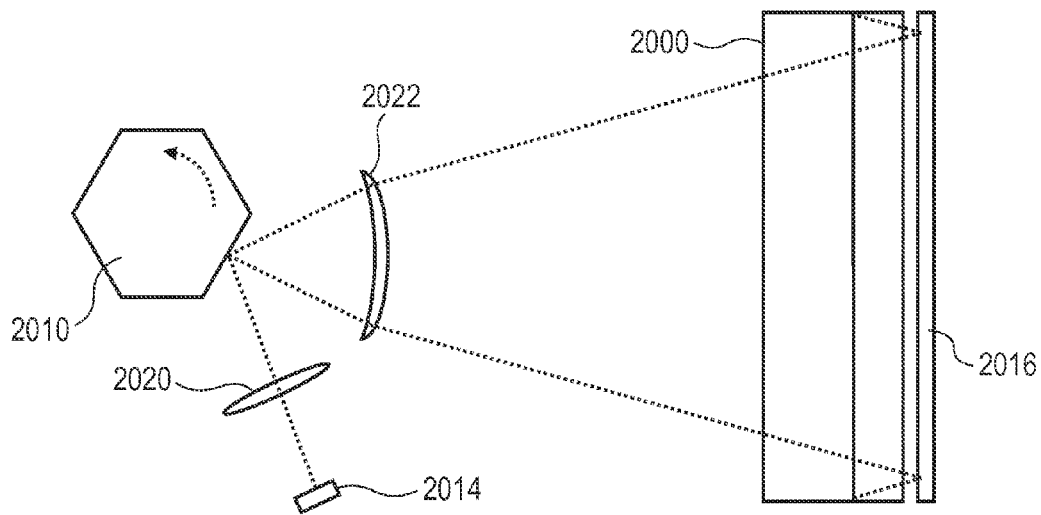
FIG. 16A is a structural diagram (plan view) of an electrophotographic recording-type image forming apparatus in which a vertical-cavity surface-emitting laser array is installed according to a fifth embodiment of the present invention.
Figure 16B:
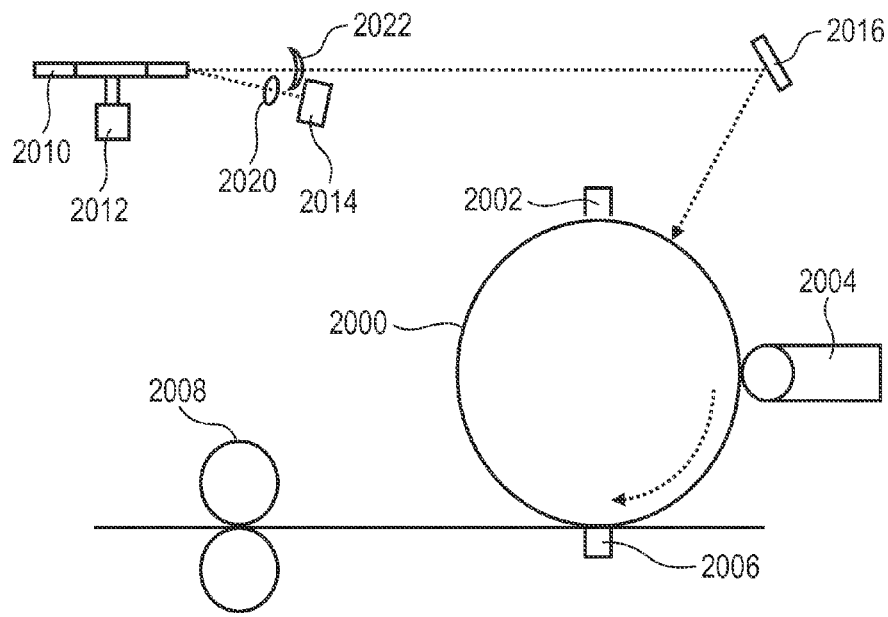
FIG. 16B is a structural diagram (side view) of the electrophotographic recording-type image forming apparatus in which the vertical-cavity surface-emitting laser array is installed according to the fifth embodiment of the present invention.

Described here with reference to FIGS. 16A and 16B is an image forming apparatus that uses a surface-emitting laser array light source in which multiple surface-emitting lasers described in one of the first to fourth embodiments are provided.

FIG. 16A is a plan view of the image forming apparatus, and FIG. 16B is a side view of the image forming apparatus. Laser light output from a surface-emitting laser array light source 2014, which is used as a recording light source, is radiated via a collimator lens 2020 toward a rotating polygon mirror 2010 which is being driven to rotate by a motor 2012.

The laser light irradiating the rotating polygon mirror 2010 is reflected as a deflected beam which changes the exit angle continuously as the rotating polygon mirror 2010 rotates. The reflected light is subjected to distortion correction and the like by an f-θ lens 2022, and then radiated via a reflecting mirror 2016 toward a photosensitive member 2000.

The photosensitive member 2000 is charged in advance by a charger 2002, and sequentially exposed to light by laser light scanning to form an electrostatic latent image. The electrostatic latent image formed on the photosensitive member 2000 is developed by a developing unit 2004, and the developed visible image is transferred to transfer paper by a transfer charger 2006. The transfer paper on which the visible image has been transferred is conveyed to a fixing unit 2008, where the image is fixed, and then discharged to the outside of the image forming apparatus.

The surface-emitting laser array light source can also be used in other optical apparatus and medical apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-249129, filed Nov. 5, 2010 which is hereby incorporated by reference herein in its entirety.

What is claimed is:

1. A method of manufacturing a surface-emitting laser with a surface relief structure which has a stepped structure for controlling a reflectance distribution, comprising:

forming a lower distributed Bragg reflector (DBR) on a substrate;

forming an active region on the lower DBR;

forming on the active region an upper DBR, which comprises a selective oxidation layer and a layered structure, the layered structure being obtained by stacking a fourth semiconductor layer, a third semiconductor layer, and a second semiconductor layer in order from the substrate side;

forming a first semiconductor layer on the upper DBR;

forming a first dielectric film on the first semiconductor layer;

patterning the first dielectric film by forming in the first dielectric film a pattern that defines the surface relief structure and a pattern that defines a mesa structure with use of a same photomask;

forming in the first semiconductor layer a pattern of the surface relief structure and a pattern of the mesa structure which are defined by the patterns in the first dielectric film, by etching the first semiconductor layer with use of the first dielectric film which has been patterned in the patterning;

forming a second dielectric film on the first semiconductor layer that comprises the pattern of the surface relief structure which has been formed in the first semiconductor layer;

forming a photoresist pattern in a manner that covers the pattern of the surface relief structure which comprises the second dielectric film;

forming the mesa structure by etching through dry etching the pattern of the mesa structure which has been formed in the first semiconductor layer;

forming a current confinement structure by selective oxidation of the selective oxidation layer;

removing the first dielectric film and the second dielectric film;

exposing a bottom face of the surface relief structure by etching the second semiconductor layer with the first semiconductor layer where the pattern of the surface relief structure has been formed as an etching mask and the third semiconductor layer as an etching stop layer;

exposing a top face of the surface relief structure by etching the first semiconductor layer where the pattern of the surface relief structure has been formed, with the second semiconductor layer and the third semiconductor layer as etching stop layer; and protecting a region of the first semiconductor layer that is located on a perimeter of the bottom face of the surface relief structure and that functions as a contact portion, wherein, when an oscillation wavelength of the surface-emitting laser is given as $\lambda$ and a refractive index of each of the semiconductor layers is given as n, a total thickness of the second semiconductor layer, the third semiconductor layer, and the fourth semiconductor layer is an integral multiple of $\lambda/2n$.

2. The method of manufacturing a surface-emitting laser according to claim 1, wherein the protecting of the region of the first semiconductor layer is executed after the forming of the current confinement structure and before the exposing of the top face of the surface relief structure, and wherein the protecting of the region of the first semiconductor layer is accomplished by forming a photoresist.

3. The method of manufacturing a surface-emitting laser according to claim 1, further comprising:

forming a fifth semiconductor layer on the first semiconductor layer, which has been formed in the forming of the first semiconductor layer; and patterning the fifth semiconductor layer by forming in the fifth semiconductor layer a pattern that defines the surface relief structure and a pattern that defines the mesa structure with use of a photomask, wherein the forming of the fifth semiconductor layer and the patterning of the fifth semiconductor layer are executed after the forming of the first semiconductor layer and before the forming of the first dielectric film.

4. The method of manufacturing a surface-emitting laser according to claim 3, wherein the fifth semiconductor layer is formed from $Al_xGa_{1-x}As$ (x>0.4).

5. The method of manufacturing a surface-emitting laser according to claim 3, wherein the fifth semiconductor layer is formed from the same material as a material of the second semiconductor layer, and is thicker than the second semiconductor layer.

6. The method of manufacturing a surface-emitting laser according to claim 1, wherein, when refractive indices of the fourth semiconductor layer, the third semiconductor layer, the second semiconductor layer, and the first semiconductor layer are given as n4, n3, n2, and n1, respectively, the refractive indices satisfy a relation $n4<n3<n2<n1$.

7. The method of manufacturing a surface-emitting laser according to claim 1, wherein, when refractive indices of the fourth semiconductor layer, the third semiconductor layer, the second semiconductor layer, and the first semiconductor layer are given as n4, n3, n2, and n1, respectively, the refractive indices satisfy a relation $n4>n3>n2<n1$.

8. The method of manufacturing a surface-emitting laser according to claim 1, wherein the protecting of the region of the first semiconductor layer is executed before the exposing of the top face of the surface relief structure.

9. The method of manufacturing a surface-emitting laser according to claim 1, wherein the protecting of the region of the first semiconductor layer is executed before the exposing of the bottom face of the surface relief structure.

10. The method of manufacturing a surface-emitting laser according to claim 1, wherein the first semiconductor layer is formed from GaAs and the second semiconductor layer is formed from $Al_xGa_{1-x}As$ (x>0), and wherein the first semiconductor layer is etched with an etchant that is a citric acid-based aqueous solution.

11. The method of manufacturing a surface-emitting laser according to claim 1, wherein the second semiconductor layer is formed from $Al_xGa_{1-x}As$ (x>0), and the third semiconductor layer is formed from AlGaInP, and wherein the second semiconductor layer is etched with an etchant that is a phosphoric acid-based aqueous solution.

12. The method of manufacturing a surface-emitting laser according to claim 1, wherein the first dielectric film and the second dielectric film are etched with an etchant that is buffered hydrofluoric acid.

13. The method of manufacturing a surface-emitting laser according to claim 1,
   wherein the protecting of the region of the first semiconductor layer is executed after the forming of the current confinement structure and before the exposing of the top face of the surface relief structure, and
   wherein the protecting of the region of the first semiconductor layer is accomplished by forming a third dielectric film.

14. A method of manufacturing a surface-emitting laser array, comprising arranging multiple surface-emitting lasers manufactured by the method of manufacturing a surface-emitting laser according to claim 1, to thereby manufacture a surface-emitting laser array.

* * * * *